United States Patent
Yoshii et al.

(10) Patent No.: US 6,707,074 B2
(45) Date of Patent: Mar. 16, 2004

(54) SEMICONDUCTOR LIGHT-EMITTING DEVICE AND APPARATUS FOR DRIVING THE SAME

(75) Inventors: Shigeo Yoshii, Hirakata (JP); Kiyoshi Ohnaka, Sakai (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/895,213

(22) Filed: Jul. 2, 2001

(65) Prior Publication Data

US 2002/0030195 A1 Mar. 14, 2002

(30) Foreign Application Priority Data

Jul. 4, 2000 (JP) ........................................ 2000-201898

(51) Int. Cl.[7] ...................... H01L 29/41; H01L 29/24; H01L 29/221
(52) U.S. Cl. ...................... 257/101; 257/79; 257/94; 257/96; 257/97
(58) Field of Search ................. 257/79–103; 372/43–50

(56) References Cited

U.S. PATENT DOCUMENTS

| | | | |
|---|---|---|---|
| 5,010,382 A | | 4/1991 | Katoh |
| 5,159,603 A | * | 10/1992 | Kim ............................ 372/45 |
| 5,476,811 A | * | 12/1995 | Fujii et al. .................. 432/105 |
| 6,072,189 A | * | 6/2000 | Duggan ........................ 257/14 |
| 6,350,997 B1 | * | 2/2002 | Saeki ........................... 257/102 |

FOREIGN PATENT DOCUMENTS

| | | |
|---|---|---|
| JP | 60-167390 | 8/1985 |
| JP | 61-053768 | 3/1986 |
| JP | 61-059793 | 3/1986 |
| JP | 61-131491 | 6/1986 |
| JP | 61-231788 | 10/1986 |
| JP | 61-270885 | 12/1986 |
| JP | 62-189750 | 8/1987 |
| JP | 62-244186 | 10/1987 |
| JP | 63-024692 | 2/1988 |
| JP | 02-280338 | 11/1990 |
| JP | 03-008340 | 1/1991 |
| JP | 04-075347 | 3/1992 |

OTHER PUBLICATIONS

Notice of Reasons of Rejection (Dated Feb. 4, 2003).
J. Shibata et al., "Fundamental Characteristics of an InGaAsP/InP Laser Transistor", Electronics Letters, vol. 21, No. 3, pp. 98–100, Jan. 31, 1985.
Yoshiro Mori et al., "Operation principle of the InGaAsP/InP laser transistor", Appl. Phys. Lett. 47(7), pp. 649–651, Oct. 1, 1985.

* cited by examiner

Primary Examiner—Nathan J. Flynn
Assistant Examiner—J. P. Mondt
(74) Attorney, Agent, or Firm—McDermott, Will & Emery

(57) ABSTRACT

A semiconductor light-emitting device has first and second semiconductor layers each of a first conductivity type, a third semiconductor layer of a second conductivity type provided between the first and second semiconductor layers, and an active layer provided between the second and third semiconductor layers to emit light with charge injected therein from the second and third semiconductor layers. A graded composition layer is provided between the active layer and the third semiconductor layer to have a varying composition which is nearly equal to the composition of the active layer at the interface with the active layer and to the composition of the third semiconductor layer at the interface with the third semiconductor layer.

10 Claims, 20 Drawing Sheets

SEMICONDUCTOR LIGHT-EMITTING DEVICE AND APPARATUS FOR DRIVING THE SAME

BACKGROUND OF THE INVENTION

The present invention relates to a semiconductor light-emitting device in a triode configuration such as a light-emitting diode device or a semiconductor laser device and to an apparatus for driving the same.

Light-emitting diode devices have been used widely as low-cost and high-reliability light-emitting devices in remote control equipment and optical fiber communication.

However, conventional light-emitting diode devices have the problems of low response speed and low upper-limit modulation frequency in performing high-speed communication, i.e., high-speed modulation.

Factors that limit the operating speed of a semiconductor light-emitting device represented by a light-emitting diode device include the speed at which carriers injected in the active layer are recombined. The carriers injected in the active region of the light-emitting device do not disappear immediately after current injection is halted but disappear gradually in accordance with a time constant determined by the recombination speed.

Since the light-emitting state continues while the carriers remain in the active region, the carriers remaining in the active region prevent high-speed response of the light-emitting device during modulation. Since the light-emitting diode device utilizes spontaneous light emission and the amount of light emitted therefrom is nearly proportional to the quantity of carriers in the active region, the remaining carriers exert particularly great influence on the response speed of the light-emitting diode device. In a light-emitting diode device composed of a Group III-V compound semiconductor containing, e.g., aluminium gallium arsenide (AlGaAs) as a main component, the time constant determined by the carrier recombination speed is normally several nanoseconds (ns) so that it is difficult to perform high-speed modulation at a modulation frequency exceeding 1 GHz.

As prior art technology for eliminating the limit placed by the carrier recombination speed on the modulation speed, a light-emitting device using a triode configuration similar to that of a transistor device is disclosed in Japanese Unexamined Patent Publication No. SHO 60-167390.

FIG. 17 shows a cross-sectional structure of the triode light-emitting device disclosed in the publication.

As shown in FIG. 17, the semiconductor light-emitting device disclosed in the publication comprises a p-type collector layer 902, an n-type base layer 903, and a p-type emitter layer 905 formed successively on a p-type semiconductor substrate 901, similarly to a bipolar transistor.

An active layer 904 is provided between the base layer 903 and the emitter layer 905. The active layer 904 is surrounded by an n-type buried layer 907 formed in the peripheral region thereof.

An emitter electrode 909 is formed on the emitter layer 905 with a p-type contact layer 906 interposed therebetween. A base electrode 910 is formed on the buried layer 907 with an n-type contact layer 908 interposed therebetween so as to surround the emitter electrode 909. A collector electrode 911 is formed on the surface of the semiconductor substrate 901 opposite to the collector layer 902.

A description will be given herein below to the operation of the conventional semiconductor light-emitting device.

FIG. 18 shows the structure of electron energy bands in the conventional semiconductor light-emitting device during a light-emitting period, in which the vertical axis represents the energy of electrons and $E_C$, $E_V$, and $E_F$ generally represent energy at the lower end of the conduction band, energy at the upper end of the valence band, and the energy of electrons or holes on a quasi-Fermi level, respectively. The reference numerals associated with the energy levels correspond to the semiconductor layers shown in FIG. 17.

As an example of driving voltage applied during the light-emitting period, a voltage in a forward direction (forward bias voltage) is applied between the base layer 903 and the emitter layer 905 such that the base layer 903 and the collector layer 902 are set at an equal potential of 0 V.

Since the forward bias voltage is applied between the base layer 903 and the emitter layer 905, electrons injected from the base layer 903 and holes injected from the emitter layer 905 are accumulated in the active layer 904 and recombined to emit light. Although a depletion layer is formed between the p-type collector layer 902 and the n-type base layer 903 due to the pn junction, at least a part of the base layer 903 is not depleted so that the electrons are supplied from the undepleted portion to the active layer 904. The base layer 903 functions as a barrier for confining the holes to the active layer.

During a light-extinct period, a voltage in a reverse direction (reverse bias voltage) is applied between the base layer 903 and the collector layer 902. This depletes substantially the entire region of the base layer 903, as shown in the energy-band diagram of FIG. 19, so that the holes confined to the active layer 904 are extracted to the collector layer 902. If the holes can be extracted from the active layer 904 with sufficiently high efficiency, the concentration of the holes in the active layer 904 is reduced so that the quantity of carriers recombined for light emission is reduced and light emission is suppressed. Since the hole extracted operation is not dependent on the speed carrier recombination for light emission, light emission can be halted promptly so that high-speed modulation is allowed.

As a result of conducting various studies on the conventional semiconductor light-emitting device in the triode configuration, the present inventors have found the problem that, if low-voltage driving is performed during a light-extinct operation, some of the holes remain in the active layer 904 and emitted light remains even during the extinction period. Briefly, it is difficult to achieve a high extinction ratio, which is the ratio between the amount of light during the light-emitting period and the amount of light during the extinction period.

FIG. 20 shows in enlarged relation a band structure at the upper end of the valence band in the active layer 904 and its vicinity in the conventional semiconductor light-emitting device during the extinction period. As shown in FIG. 20, an interface barrier (spike) 920 occurs between the active layer 904 and the base layer 903 during the extinction period due to the offsetting of the valence band caused by the heterojunction therebetween. Even if the absolute value of the potential of the reverse bias voltage applied to the collector layer 902 is increased, the height of the interface barrier 902 (the magnitude of energy) does not change, which forms an obstacle to the extraction of the holes to the collector layer 902. Although some of the holes move toward the collector by surpassing the interface barrier 902 with the reverse bias voltage, holes with energy lower than the height of the interface barrier 902 remain at the interface between the active layer 904 and the base layer 903. If a higher reverse bias voltage is applied, some of the holes with lower energy are transported by a tunnel current to the collector layer 902 but the reverse bias voltage with the higher absolute value also increases the amount of heat generated from the device as well as power consumption.

At this time, the holes are supplied from the emitter layer 905 to the active layer 904 so that, if the concentration of the holes is increased at the interface between the active layer 904 and the base layer 903, the quantity of holes accumulated in the entire active layer 904 is increased. In the conventional semiconductor light-emitting device, therefore, it is difficult to sufficiently reduce the quantity of holes in the active layer 904 with a low reverse bias voltage and a considerable amount of light is emitted from the active layer 904 even during the extinction period.

Thus, it is difficult to achieve a higher extinction ratio in the conventional semiconductor light-emitting device in the triode configuration during the low-voltage driving.

SUMMARY OF THE INVENTION

It is therefore an object of the present invention to allow high-speed operation with a low voltage and provide a practical extinction ratio by solving the conventional problems.

To attain the foregoing object, a first semiconductor light-emitting device according to the present invention comprises: first and second semiconductor layers each of a first conductivity type; a third semiconductor layer of a second conductivity type provided between the first and second semiconductor layers; an active layer provided between the second and third semiconductor, the active layer emitting light with charge injected therein from the second and third semiconductor layers; and a graded composition layer provided between the active layer and the third semiconductor layer to have a varying composition which is equal to a composition of the active layer at an interface with the active layer and to a composition of the third semiconductor layer at an interface with the third semiconductor layer.

If the third semiconductor layer of the known semiconductor light-emitting device is a base layer, the active layer and the base layer are composed of heterojunctions, as described above. Accordingly, a band offset causes an interface barrier when a reverse bias voltage is applied during an extinction period. However, the first semiconductor light-emitting device of the present invention has the graded composition layer between the active layer and the third semiconductor layer, which eliminates the band offset and therefore prevents the occurrence of the interface barrier. As a result, even a low reverse bias voltage achieves a sufficient reduction in the quantity of carriers remaining in the active layer so that a higher extinction ratio is achieved by low-voltage driving.

A second semiconductor light-emitting device according to the present invention comprises: first and second semiconductor layers each of a first conductivity type; a third semiconductor layer of a second conductivity type provided between the first and second semiconductor layers, the third semiconductor layer having a forbidden band as an electron energy band which is smaller in width than a forbidden band in each of the first and second semiconductor layers; and a graded composition layer provided between the first and third semiconductor layers to have a varying composition which is nearly equal to a composition of the first semiconductor layer at an interface with the first semiconductor layer and to a composition of the third semiconductor layer at an interface with the third semiconductor layer, the third semiconductor layer emitting light with charge injected therein from the second and third semiconductor layers.

If the third semiconductor layer of the second semiconductor light-emitting device is the base layer, the base layer functions as a substantial active layer since the forbidden band width in the base layer is smaller than the forbidden band width in each of the first and second semiconductor layers. Thus, even in the semiconductor light-emitting device which does not have an independent active layer, the graded composition layer provided between the first semiconductor layer (collector layer) and the third semiconductor layer (base layer) eliminates the band offset and therefore prevents the occurrence of the interface barrier. As a result, even a low reverse bias voltage achieves a sufficient reduction in the quantity of carriers remaining in the third semiconductor layer so that a higher extinction ratio is achieved by low-voltage driving.

A third semiconductor light-emitting device according to the present invention comprises: first and second semiconductor layers each of a p-type conductivity; and a third semiconductor layer of an n-type conductivity provided between the first and second semiconductor layers, the third semiconductor layer having a forbidden band as an electron energy band which is smaller in width than a forbidden band in each of the first and second semiconductor layers, the third semiconductor layer emitting light with charge injected therein from the second and third semiconductor layers, an energy value at an upper end of a valence band as an electron energy band being lower in the first semiconductor layer than in the second semiconductor layer.

In the third semiconductor light-emitting device, the third semiconductor layer functions as a substantial active layer, similarly to the second semiconductor light-emitting device of the present invention. If the first semiconductor layer is a collector layer and the second semiconductor layer is an emitter layer, an energy value at the upper end of the valence band is lower in the collector layer as the first semiconductor layer than in the emitter layer as the second semiconductor layer. This suppresses current injection from the collector layer without interrupting current injection from the emitter during a light-emitting period. This also suppresses a leakage current from the emitter layer to the collector layer and achieves a higher extinction ratio.

A fourth semiconductor light-emitting device according to the present invention comprises: first and second semiconductor layers each of an n-type conductivity; and a third semiconductor layer of a p-type conductivity provided between the first and second semiconductor layers, the third semiconductor layer having a forbidden band as an electron energy band which is smaller in width than a forbidden band in each of the first and second semiconductor layers, the third semiconductor layer emitting light with charge injected therein from the second and third semiconductor layers, an energy value at a lower end of a conduction band as an electron energy band being higher in the first semiconductor layer than in the second semiconductor layer.

In the fourth semiconductor light-emitting device, the third semiconductor layer functions as a substantial active layer, similarly to the second semiconductor light-emitting device of the present invention. If the first semiconductor layer is a collector layer and the second semiconductor layer is an emitter layer, an energy value at the lower end of the conduction band as an electron energy band is higher in the collector layer as the first semiconductor layer than in the emitter layer as the second semiconductor layer. This suppresses current injection from the collector layer without interrupting current injection from the emitter during the light-emitting period. This also suppresses a leakage current from the emitter layer to the collector layer and achieves a higher extinction ratio.

In each of the second to fourth semiconductor light-emitting devices, an impurity concentration in the second semiconductor layer is preferably higher at least in a region thereof opposed to the first semiconductor layer than in the first semiconductor layer. If the first semiconductor layer is a collector layer and the second semiconductor layer is an emitter layer, the second semiconductor layer is higher in impurity concentration than in the first semiconductor layer so that the efficiency of carrier injection from the second semiconductor layer (emitter layer) is improved.

A fifth semiconductor light-emitting device according to the present invention comprises: first and second semiconductor layers each of a first conductivity type; a third semiconductor layer of a second conductivity type provided between the first and second semiconductor layers, the third semiconductor layer having a forbidden band as an electron energy band which is smaller in width than a forbidden band in each of the first and second semiconductor layers; and a lightly doped semiconductor layer provided between the first and third semiconductor layers, the lightly doped semiconductor layer having an impurity concentration which is lower than an impurity concentration in each of the first and third semiconductor layers, the third semiconductor layer emitting light with charge injected therein from the second and third semiconductor layers.

In the fifth semiconductor light-emitting device, the third semiconductor layer functions as a substantial active layer, similarly to the second semiconductor light-emitting device of the present invention. If the first semiconductor layer is a collector layer, the potential gradient in the interface barrier between the third semiconductor layer (base layer) and the first semiconductor layer (collector layer) becomes sharp during the extinction period due to the lightly doped semiconductor layer provided between the first and third semiconductor layers, which prevents carriers from remaining in the interface barrier portion. As a result, even a low reverse bias voltage achieves a sufficient reduction in the quantity of carriers remaining in the third semiconductor layer so that a higher extinction ratio is achieved by low-voltage driving.

In the fifth semiconductor light-emitting device, the lightly doped semiconductor layer is preferably an undoped layer undoped with an impurity.

In the fifth semiconductor light-emitting device, the lightly doped semiconductor layer preferably has the second conductivity type. In the arrangement, the lightly doped semiconductor layer provided between the first semiconductor layer (collector layer) and the third semiconductor layer (base layer) forms a pn junction between itself and the first semiconductor layer. During the light-emitting period, therefore, a barrier against carriers injected from the first semiconductor layer (collector layer) to the third semiconductor layer (base layer) occurs during the light-emitting period even with the application of a forward bias voltage between the collector and the base. The barrier prevents carrier injection in a reverse direction from the first semiconductor layer (collector layer) even if the first semiconductor layer (collector layer) and the second semiconductor layer (emitter layer) are set at equal values.

An apparatus for driving a semiconductor light-emitting device according to the present invention assumes an apparatus for driving a semiconductor light-emitting device comprising first and second semiconductor layers each of a first conductivity type and a third semiconductor layer of a second conductivity type provided between the first and second semiconductor layers, the apparatus comprising: constant-current control means; light-emission control means for controlling a state of light emitted from the semiconductor light-emitting device; and specified-potential applying means for applying a specified potential to the third semiconductor layer of the semiconductor light-emitting device, the constant-current control means supplying a specified driving current to the second semiconductor layer of the semiconductor light-emitting device, the light-emission control means adjusting an amount of light emitted from the semiconductor light-emitting device by applying different voltages to the first semiconductor layer or by bringing the first semiconductor layer into different states of impedance.

The apparatus for driving a semiconductor light-emitting device according to the present invention ensures the light-emitting and light-extinct operations of a semiconductor light-emitting device in a triode configuration.

DETAILED DESCRIPTION OF THE INVENTION

Embodiment 1

A first embodiment of the present invention will be described with reference to the drawings.

In each of the embodiments of the present invention, the same terminology as used for a bipolar transistor will be used to refer to the three semiconductor layers of a semiconductor light-emitting device in a triode configuration. That is, a first semiconductor layer of a first conductivity type is termed a collector layer, a second semiconductor layer of the first conductivity type is termed an emitter layer, and a third semiconductor layer of a second conductivity type is termed a base layer.

Figure 1:
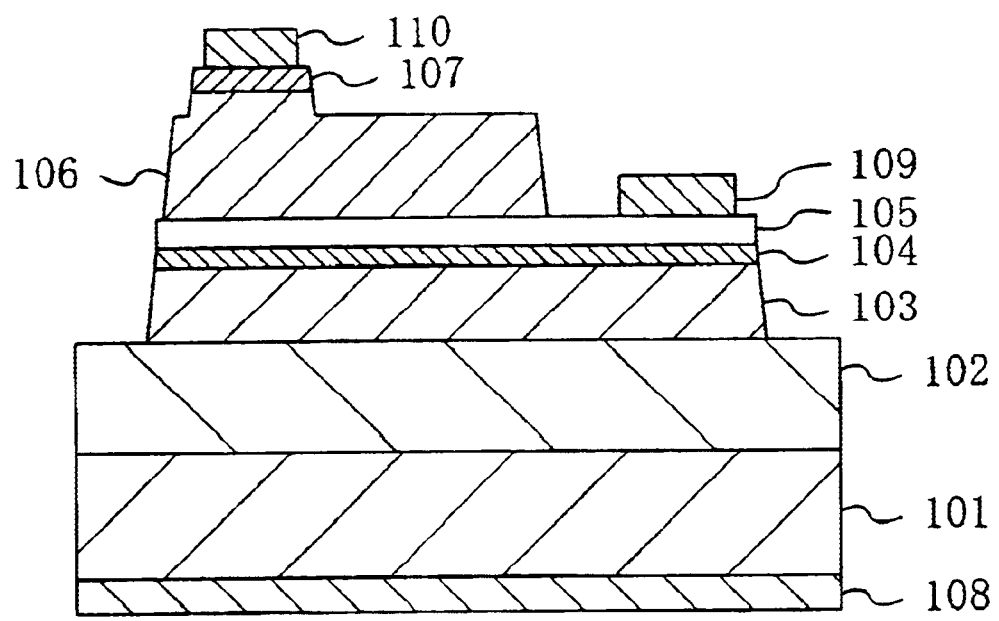
FIG. 1 is a structural cross-sectional view of a pnp-type semiconductor light-emitting device in a triode configuration according to a first embodiment of the present invention.

FIG. 1 shows a cross-sectional structure of a semiconductor light-emitting device in a triode configuration according to the first embodiment, which is a pnp-type semiconductor light-emitting device composed of a GaAs/GaInP-based compound semiconductor.

As shown in FIG. 1, the semiconductor light-emitting device according to the first embodiment has a collector layer 102 composed of p-type gallium indium phosphide (GaInP), a base layer 103 composed of n-type gallium indium phosphide (GaInP) with a thickness of about 300 nm, a graded composition layer 104 with a thickness of about 50 nm, an active layer 105 composed of GaAs with a thickness of about 100 nm, and an emitter layer 106 composed of p-type GaInP which are formed successively on a substrate 101 composed of p-type gallium arsenide (GaAs).

The first embodiment features the graded composition layer 104 provided between the base layer 103 and the active layer 105 to have a composition which is equal to the composition of the base layer 103 at the interface with the base layer 103 and to the composition of the active layer 105 at the interface with the active layer 105. If the film thickness of the graded composition layer 104 is about 5 nm to about 100 nm, the occurrence of an interface barrier can be suppressed. The composition of the graded composition layer 104 may be varied continuously or stepwise. Since light is emitted from the region of the graded composition layer 104 closer to the active layer 105, it is also possible to regard the region as a part of the active layer 105.

A p-type collector electrode 108 is formed on the surface of the substrate 101 opposite to the collector layer 102.

The upper surface of the active layer 105 is exposed and an n-type base electrode 109 is formed on the exposed region in spaced apart relation to the side surface of the emitter layer 106. Thus, the n-type base electrode 109 according to the first embodiment is provided not directly on the upper surface of the base layer 103 but with the graded composition layer 104 and active layer 105 interposed therebetween. Since the active layer 105 having the forbidden band as an electron energy band which is smaller in width than the forbidden band in the base layer 103 is used as a substantial contact layer for the n-type base electrode 109, the contact resistance of the n-type base electrode 109 can be reduced.

To give higher priority to the efficiency of electron injection, the regions of the active layer 105 and the graded composition layer 104 lying between the n-type base electrode 109 and the emitter layer 106 are left unremoved. However, it is also possible to improve the efficiency with which holes injected from the emitter layer 106 are confined by removing the regions.

A p-type contact layer 107 composed of p-type high-concentration GaAs is formed on a part of the emitter layer 106. A p-type emitter electrode 110 is formed on the p-type contact layer 107.

In the first embodiment, an impurity concentration in each of the graded composition layer 104 and the active layer 105 is adjusted to about $6\times10^{16}$ cm$^{-3}$ and an impurity concentration in each of the collector layer 102, the base layer 103, and the emitter layer 106 is adjusted to about $1\times10^{17}$ cm$^{-3}$.

In the first embodiment, a mixed crystal composed of GaInP having a composition which substantially lattice-matches with the substrate 101 composed of GaAs is used for the collector layer 102, the base layer 103, and the emitter layer 106. This reduces the resistivity of each of the collector layer 102, the base layer 103, and the emitter layer 106 to a low value, while allowing a large band offset between the active layer 105 composed of GaAs and each of the collector layer 102, the base layer 103, and the emitter layer 106 each composed of GaInP.

Since the base layer 103 and the active layer 105 are provided discretely, the resistance of carriers injected from the n-type base electrode 109 in a direction parallel to the substrate surface is reduced, which suppresses delayed operation and increased power consumption each resulting from device resistance.

A description will be given herein below to the light-emitting operation and light-extinct operation of the semiconductor light-emitting device thus constituted.

During a light-emitting period, the semiconductor light-emitting device according to the first embodiment applies a forward bias voltage between the base layer 103 and the emitter layer 106 and adjusts the potential between the base layer 103 and the collector layer 102 to 0 V, thereby confining carriers to the active layer 105. The confined carriers, i.e., electrons and holes are recombined in the active layer 105, thereby causing light emission.

Figure 2:
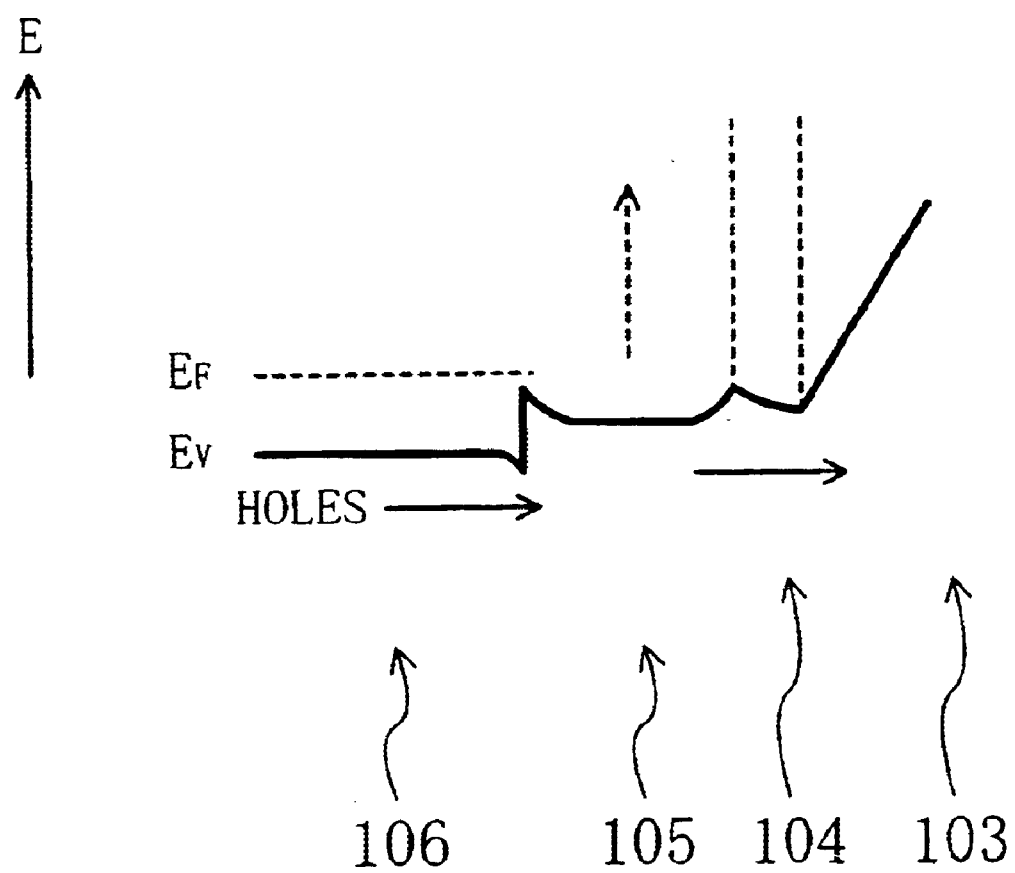
FIG. 2 is a band diagram showing the energy of electrons at an end of the valence band in an active layer and its vicinity in the semiconductor light-emitting device according to the first embodiment during an extinction period.

During an extinction period, a reverse bias voltage is applied between the base layer 103 and the collector layer 102. FIG. 2 shows a band structure at an end of the valence band in the active layer 105 and its vicinity. In FIG. 2, reference numerals associated with the energy levels correspond to the semiconductor layers shown in FIG. 1.

Figure 17:
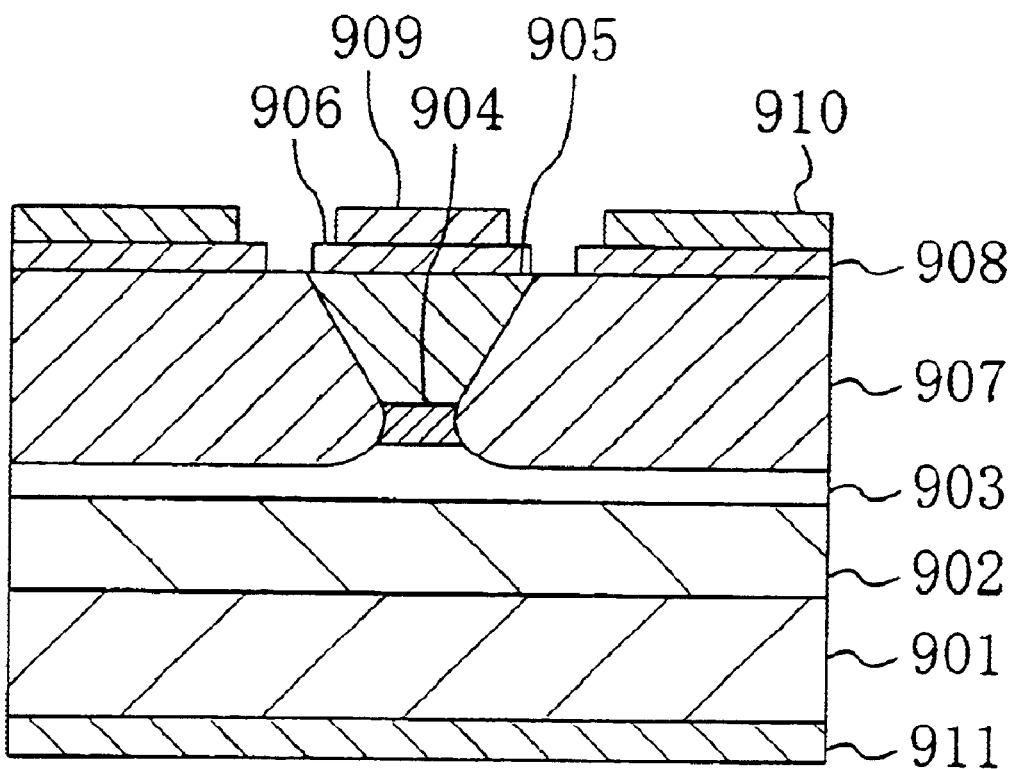
FIG. 17 is a structural cross-sectional view of a conventional semiconductor light-emitting device in a triode configuration.
Figure 18:
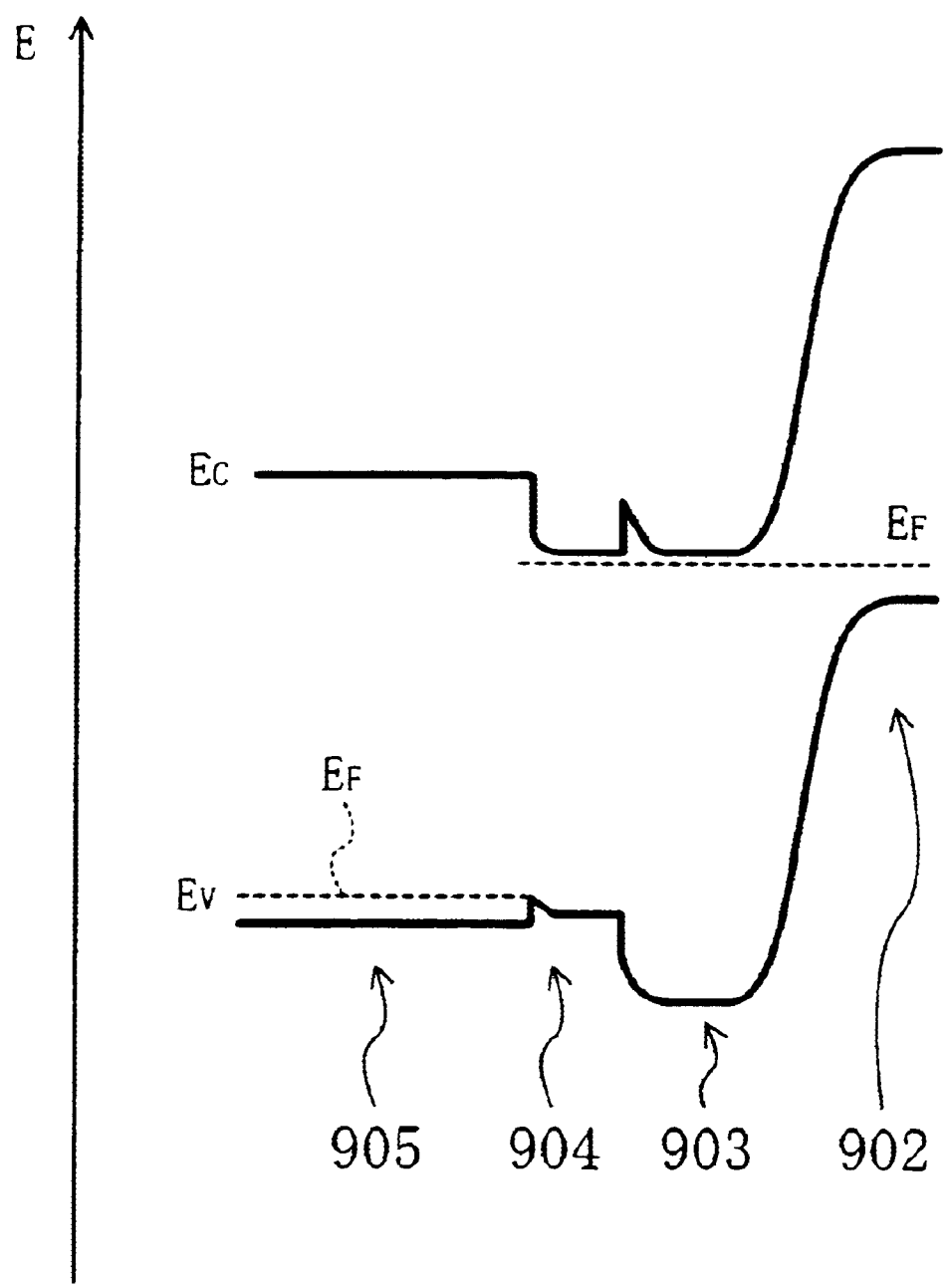
FIG. 18 is a band diagram of the electron energy bands in the conventional semiconductor light-emitting device during the light-emitting period.
Figure 19:
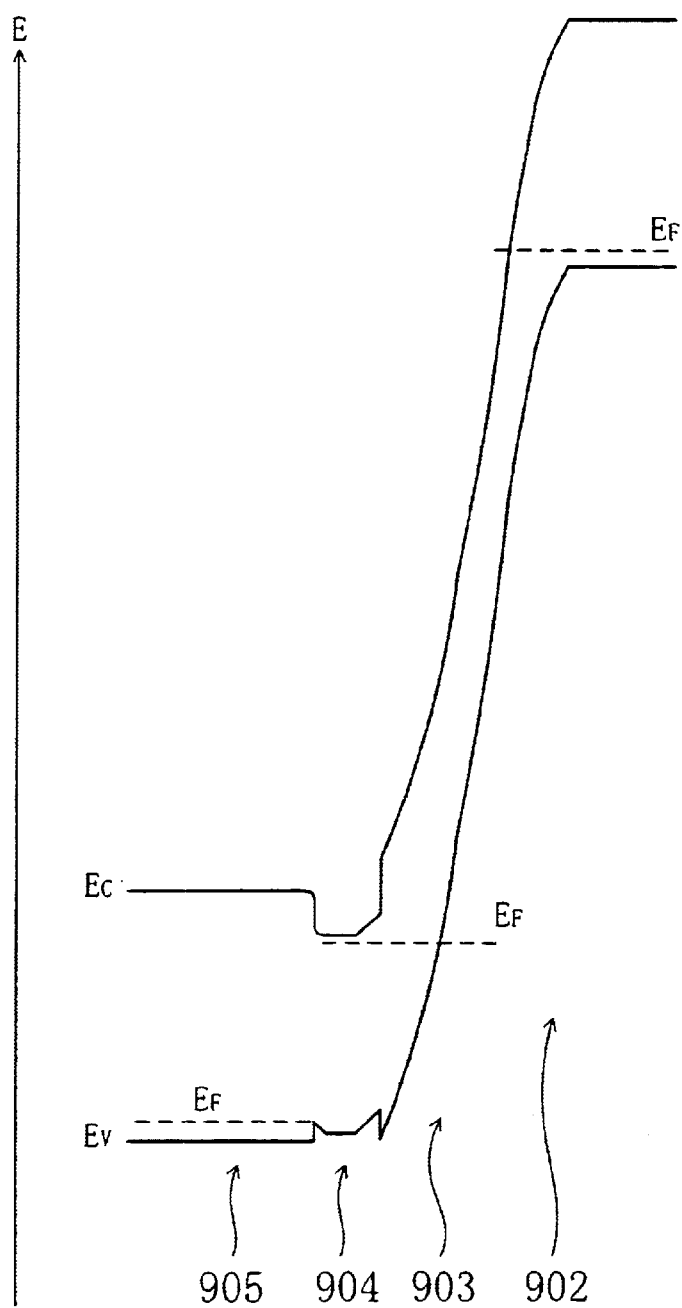
FIG. 19 is a band diagram of the electron energy bands in the conventional semiconductor light-emitting device during the light-emitting period.
Figure 20:
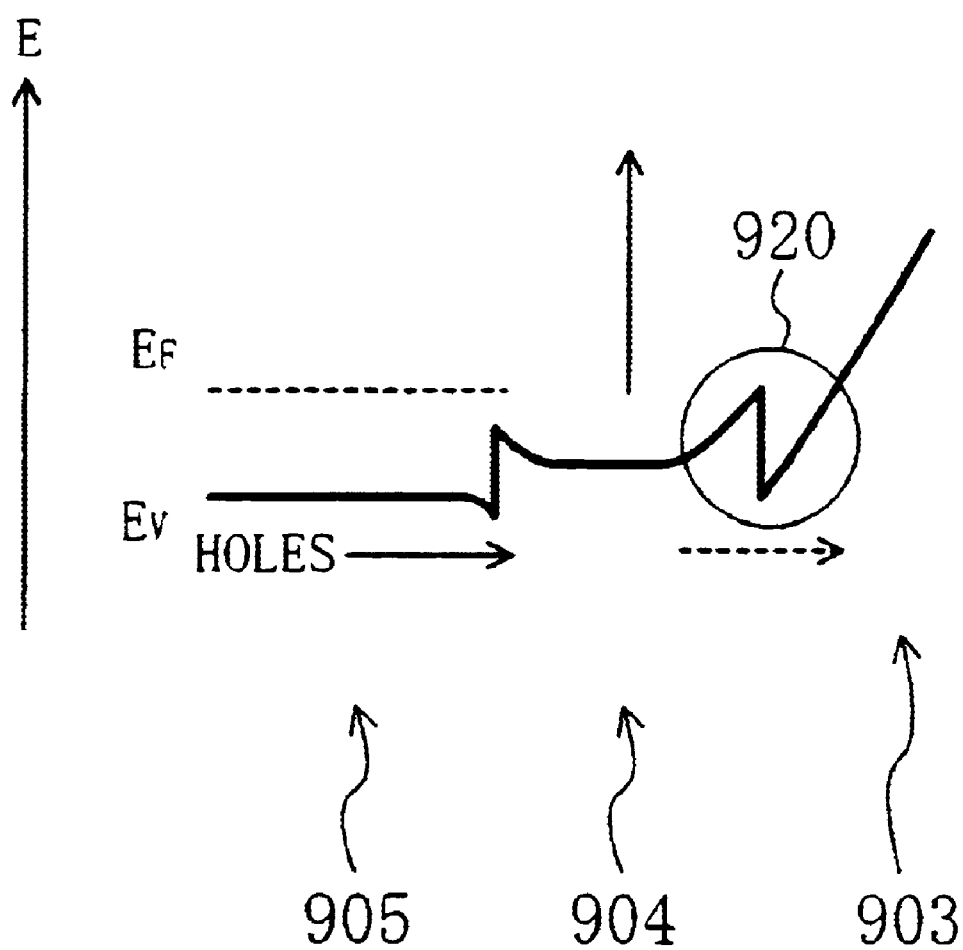
FIG. 20 is a band diagram showing the electron energy bands at an end of the valence band in an active layer and its vicinity in the conventional semiconductor light-emitting device and its vicinity during the extinction period.

As shown in FIG. 2, the graded composition layer 104 is provided between the active layer 105 and the base layer 103 to have a gradually varying composition which is equal to the composition of the active layer 105 at the interface with the active layer 105 and to the composition of the base layer 103 at the interface with the base layer 103. As a consequence, the interface barrier between the active layer 105 and the base layer 103 is reduced greatly compared with the semiconductor light-emitting device according to the conventional embodiment shown in FIG. 17. Even with a relatively low reverse voltage, therefore, the holes reaching the interface between the active layer 105 and the graded composition layer 104 swiftly move to the collector layer 103 so that the concentration of holes in the region of the active layer 105 closer to the base layer 103 is reduced significantly. As a result, the quantity of holes accumulated in the whole active layer 105 is also reduced, which achieves a significant reduction in the amount of residual light emitted from the semiconductor light-emitting device during the extinction period. the interface between the active layer 105 and the graded composition layer 104 swiftly move to the collector layer 103 so that the concentration of holes in the region of the active layer 105 closer to the base layer 103 is reduced significantly. As a result, the quantity of holes accumulated in the whole active layer 105 is also reduced, which achieves a significant reduction in the amount of residual light emitted from the semiconductor light-emitting device during the extinction period.

Even during the light-emitting period, the graded composition layer 104 provided between the active layer 105 and the base layer 103 also reduces an energy barrier (spike) at the lower end of the conduction band between the active layer 105 and the base layer 103, though it is not depicted. This also improves the efficiency of electron injection in the active layer 105 during the light-emitting period.

Thus, the first embodiment achieves a high extinction ratio with a reverse bias voltage lower than in the semiconductor light-emitting device according to the conventional embodiment. This enables high-speed switching between the light-emitting operation and the light-extinct operation.

In the semiconductor light-emitting device according to the first embodiment, the depletion layer between the base and the collector is also formed even during the light-emitting period, which is different from the conventional light-emitting diode device. This reduces the electrostatic capacitance between the base layer 103 and the collector layer 102 suitably for operation by high-speed modulation.

Because of the n-type base layer 103, majority carriers injected from the base layer 103 are electrons which are higher in mobility than holes so that resistance of charge injected in a direction parallel to the substrate surface is reduced. On the other hand, minority carriers injected from the p-type emitter layer 106 into the n-type base layer 103 are holes which are smaller in diffusion length than electrons so that the diffusion of the minority carriers in a direction parallel to the substrate surface is suppressed.

Embodiment 2

A second embodiment of the present invention will be described with reference to the drawings.

Figure 3:
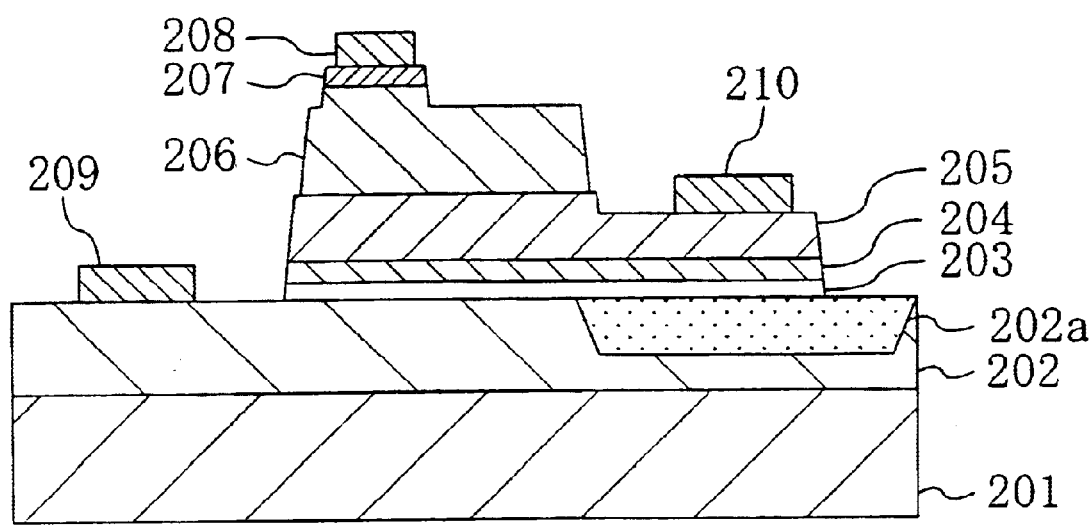
FIG. 3 is a structural cross-sectional view of an npn-type semiconductor light-emitting device in a triode configuration according to a second embodiment of the present invention.

FIG. 3 shows a cross-sectional structure of a semiconductor light-emitting device in a triode configuration according to the second embodiment, which is an npn-type semiconductor light-emitting device composed of an InGaN/GaN-based compound semiconductor.

As shown in FIG. 3, the semiconductor light-emitting device according to the second embodiment has: an emitter layer 202 composed of n-type gallium nitride (GaN); an active layer 203 composed of indium gallium nitride (InGaN); a graded composition layer 204; a base layer 205 composed of p-type GaN with a thickness of about 400 nm; and a collector layer 206 composed of n-type GaN, which are formed successively on an insulating substrate 201 composed of sapphire ($Al_2O_3$).

In the second embodiment also, the graded composition layer 204 provided between the active layer 203 and the base layer 205 has a film thickness of about 5 nm to about 100 nm and a composition which is nearly equal to the composition of the active layer 203 at the interface with the active layer 203 and to the composition of the base layer 205 at the interface with the base layer 205. Since light is emitted from the region of the graded composition layer 204 closer to the active layer 203, it is also possible to regard the region as a part of the active layer 203.

The upper surface of the emitter layer 202 is exposed and an n-type emitter electrode 209 is formed on the exposed region in spaced apart relation to the respective side surfaces of the active layer 203, the graded composition layer 204, and the like. The upper surface of the base layer 205 is exposed and a p-type base electrode 210 is formed on the exposed region in spaced apart relation to the side surface of the collector layer 206.

An n-type collector layer 207 composed of n-type high-concentration GaAs is formed on a part of the collector layer 206. An n-type collector electrode 208 is formed on the n-type contact layer 207.

In the semiconductor light-emitting device according to the second embodiment, a high-resistance region 202a is formed by ion implantation in the region of the emitter layer 202 which is opposed to the p-type base electrode 210 and not opposed to the collector layer 206. By thus providing the high-resistance region 202a in the region of the n-type emitter layer 202 which is not opposed to the n-type collector layer 206, carrier injection from the region of the n-type emitter layer 202 which is not opposed to the n-type collector layer 206 into the active layer 203 is suppressed. This prevents the deterioration of the extinction ratio due to light emission caused by carriers (electrons) remaining as a result of insufficient carrier extraction from the collector layer 206 during an extinction period.

Since the insulating substrate 201 is transparent with respect to the wavelength of emitted light, the majority of the emitted light can be extracted to the outside from the surface of the insulating substrate 201 opposite to the emitter layer 202.

Because of the npn-type configuration of the semiconductor light-emitting device according to the second embodiment, holes are supplied from the base layer 205 and electrons are supplied from the emitter layer 202 during the light-emitting period.

Conversely, the electrons are extracted from the active layer 203 to the collector layer 206 during the extinction period so that the recombination of the electrons and the holes is halted. However, the graded composition layer 204 provided between the active layer 203 and the base layer 205 to have a gradually varying composition which is nearly equal to the composition of the active layer 203 at the interface with the active layer 203 and to the composition of the base layer 205 at the interface with the base layer 205 allows swift carrier extraction at a low voltage so that high-speed modulation at a high extinction ratio is implemented at a low voltage, similarly to the first embodiment.

Embodiment 3

A third embodiment of the present invention will be described with reference to the drawings.

Figure 4:
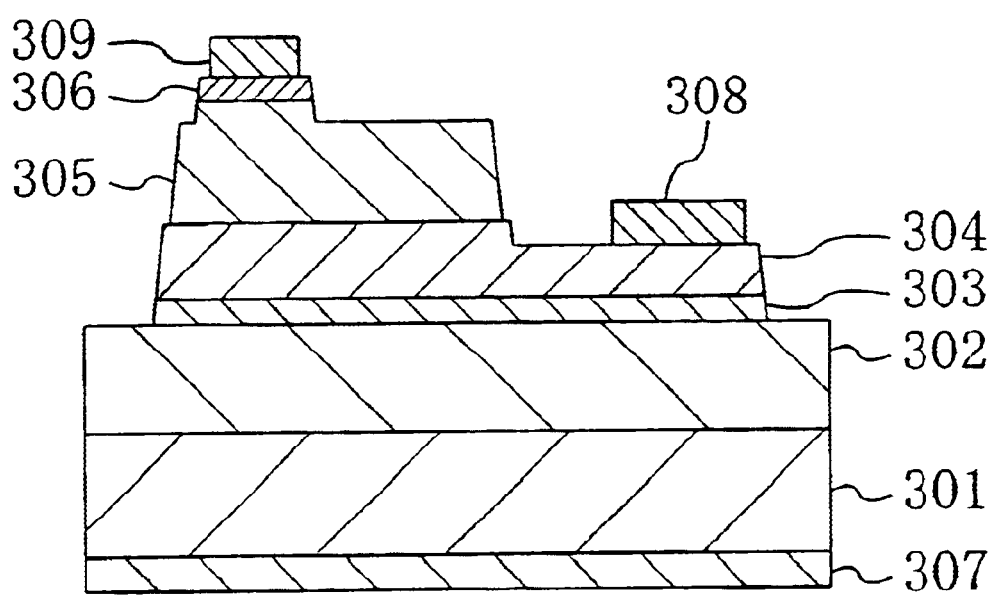
FIG. 4 is a structural cross-sectional view of a pnp-type semiconductor light-emitting device in a triode configuration according to a third embodiment of the present invention.

FIG. 4 shows a cross-sectional structure of a semiconductor light-emitting device in a triode configuration according to the third embodiment, which is a pnp-type semiconductor light-emitting device composed of an AlGaAs-based compound semiconductor.

As shown in FIG. 4, the semiconductor light-emitting device according to the third embodiment has: a collector layer 302 composed of p-type aluminium gallium arsenide ($Al_{0.4}Ga_{0.6}As$); a graded composition layer 303 with a film thickness of about 70 nm; a base layer 304 composed of n-type GaAs with a film thickness of about 300 nm; and an emitter layer 305 composed of p-type $Al_{0.3}Ga_{0.7}As$, which are formed successively on a substrate 301 composed of p-type GaAs.

The third embodiment features the graded composition layer 303 provided between the collector layer 302 and the base layer 304 to have a composition which is nearly equal to the composition of the collector layer 302 at the interface with the collector layer 302 and to the composition of the base layer 304 at the interface with the base layer 304. The film thickness of the graded composition layer 303 is adjusted appropriately to about 5 nm to about 100 nm.

The forbidden band as an electron energy band in the base layer 304 composed of n-type GaAs is smaller in width than the forbidden band in each of the collector layer 302 and the emitter layer 305 each composed of p-type AlGaAs.

A p-type collector layer 307 is formed on the surface of the substrate 301 opposite to the collector layer 302.

The upper surface of the base layer 304 is exposed and an n-type base electrode 308 is formed on the exposed region in spaced apart relation to the side surface of the emitter layer 305.

A p-type contact layer 306 composed of p-type high-concentration GaAs is formed on a part of the emitter layer 305. A p-type emitter electrode 309 is formed on the p-type contact layer 306.

In the third embodiment, an impurity concentration in each of the collector layer 302, the graded composition layer 303, and the base layer 304 is adjusted to about $1 \times 10^{17}$ $cm^{-3}$. On the other hand, an impurity concentration in the emitter layer 305 is adjusted to about $1 \times 10^{18}$ $cm^{-3}$, which is about ten times higher than the impurity concentration in the collector layer 302. As a result, the quasi-Fermi level of holes in the emitter layer 305 is closer to the upper end of the valence band than the quasi-Fermi level of holes in the collector layer 302, so that the efficiency of carrier injection from the emitter layer 305 to the base layer 304 is improved compared with the efficiency of carrier injection from the collector layer 302 to the base layer 304. If the impurity concentration in the emitter layer 305 is increased to about double the impurity concentration in the collector layer 302, the efficiency of carrier injection from the emitter layer 305 can be increased to a value higher than the efficiency of carrier injection from the collector layer 302. The impurity concentration in the emitter layer 305 is effective if at least the portion thereof opposed to collector layer 302 has an impurity concentration which is double the impurity concentration in the other portion thereof or higher.

On the other hand, p-type $Al_{0.3}Ga_{0.7}As$ is used for the emitter layer 305 and p-type $Al_{0.4}Ga_{0.6}As$ containing aluminium in a larger proportion than in the emitter layer 305 is used for the collector layer 302. As a consequence, the sum of electronic affinity and forbidden band width in the electron energy bands in the collector layer 302 is increased by about 50 meV. In other words, the energy value at the upper end of the valence band in the collector layer 302 becomes smaller than the energy value at the upper end of the valence band in the emitter layer 305 by about 50 meV. If the energy value at the upper end of the valence band in the collector layer 302 is lower by about 10 meV than in the emitter layer 305, a flow of holes into the collector layer 302 during a light-emitting period can be suppressed. In addition, a leakage current from the emitter layer 305 to the collector layer 302 can be suppressed and reverse carrier injection from the collector layer 302 to the base layer 304 can also be suppressed.

A description will be given herein below to the light-emitting operation and light-extinct operation of the semiconductor light-emitting device thus constituted.

The description will be given first to the operation during the light-emitting period.

Figure 5:
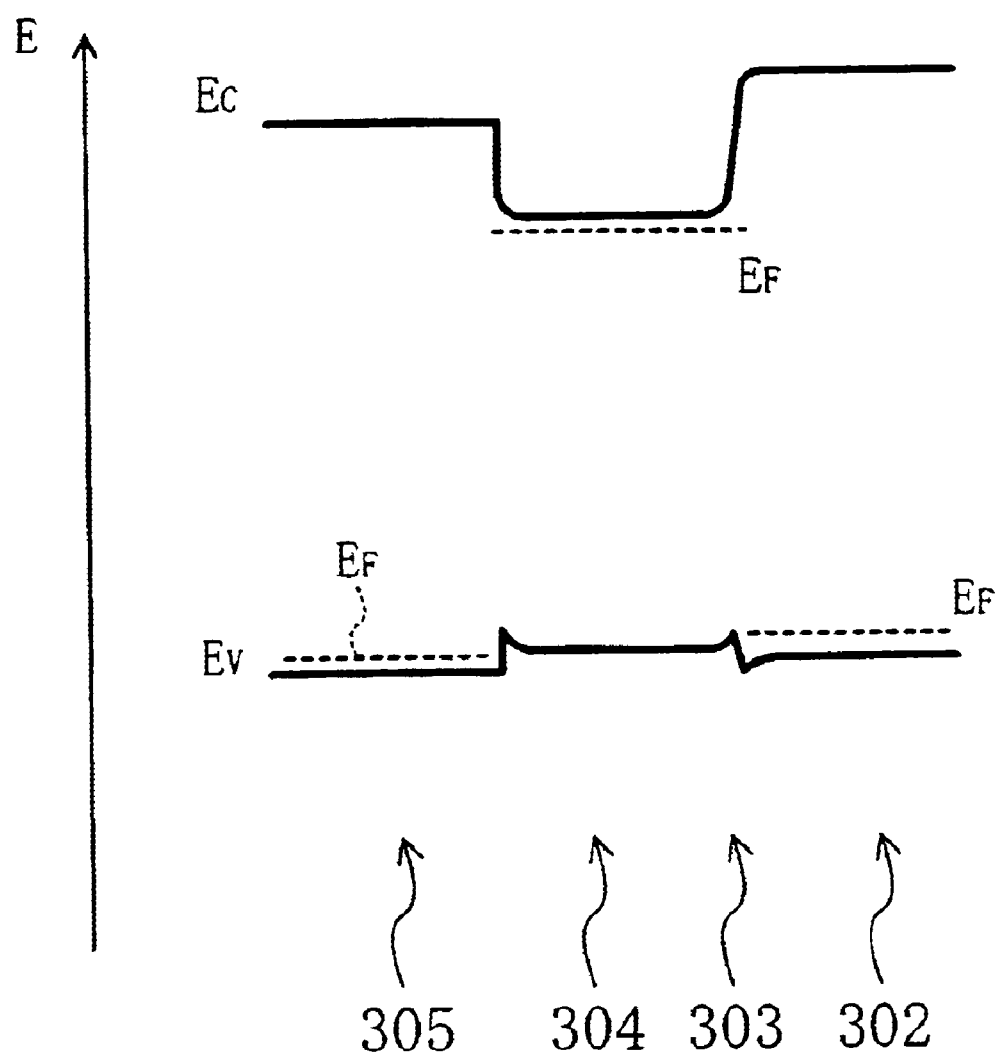
FIG. 5 is a band diagram of electron energy bands in the semiconductor light-emitting device according to the third embodiment during a light-emitting period.

FIG. 5 shows the structure of electron energy bands in the base layer 304 and its vicinity during the light-emitting period. In FIG. 5, reference numerals associated with energy levels correspond to the semiconductor layers shown in FIG. 4. In the semiconductor light-emitting device according to the third embodiment, an independent active layer is not provided between the base layer 304 and the emitter layer 305, which is different from the semiconductor light-emitting devices according to the first and second embodiments. Since the forbidden band width is smaller in the base layer 304 than in each of the collector layer and the emitter layer 305, as described above, electrons as majority carriers and holes supplied from the emitter layer 305 can be confined to the base layer 304 with simultaneous application of forward bias voltages between the base layer 304 and the emitter layer 305 and between the base layer 304 and the collector layer 302. The recombination of the electrons and the holes in the base layer 304 causes light emission. In short, the base layer 304 according to the third embodiment has the function of transporting and supplying electrons and the function as an active layer in combination.

During the light-emitting period, the voltage between the base and the collector is adjusted to a value lower by about 0.1 V than the voltage between the base and the emitter. This allows the supply of holes only from the emitter layer 305 and suppresses hole injection from the collector layer 302 to the base layer 304.

As a result, light emission does not occur in the region of the base layer 304 from which the emitter layer 305 has been removed but occurs in the region of the base layer 304 opposed to the emitter layer 305.

Since the energy value at the upper end of the valence band in the collector layer 302 is smaller by 10 meV or more than in the emitter layer 305, a leakage current formed from the holes injected from the emitter layer 305 to the base layer 304 and flowing to the collector layer 302 can be suppressed. In addition, hole injection from the collector layer 302 to the base layer 304 is suppressed.

The description will be given next to the operation during an extinction period.

Figure 6:
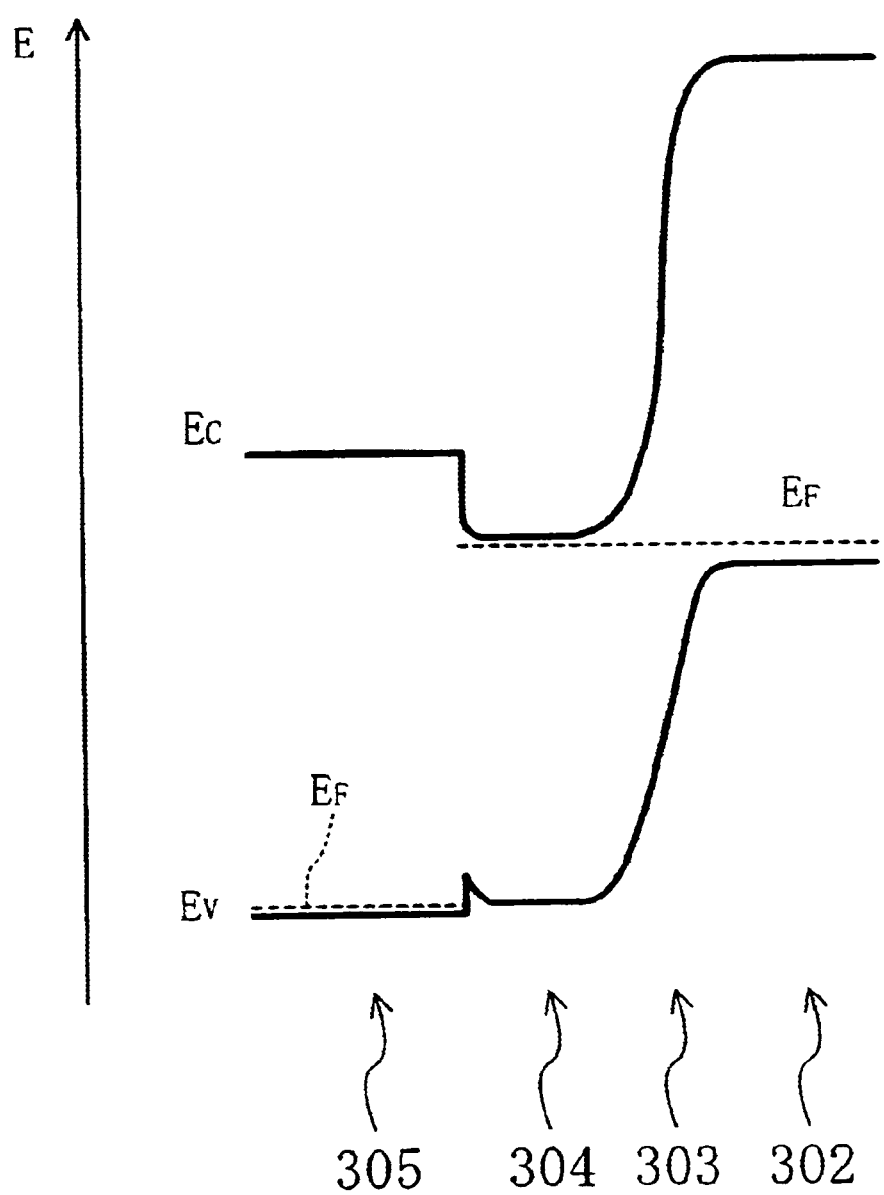
FIG. 6 is a band diagram of the electron energy bands in the semiconductor light-emitting device according to the third embodiment during the extinction period.

FIG. 6 shows the structure of electron energy bands in the base layer 304 and its vicinity during the extinction period.

During the extinction period, a forward bias voltage is applied between the base layer 304 and the emitter layer 305, while the base layer 304 and the collector layer 302 are set at equal potentials. Consequently, a depletion layer expands between the base layer 304 and the collector layer 302 and the base layer 304 cannot confine holes at the interface with the graded composition layer 303 any more. As a result, the holes accumulated in the base layer 304 are released to the collector layer 302 so that the concentration of holes in the base layer 304 is reduced and the amount of light emitted from the device is reduced. The hole releasing operation is performed at a high speed since it is not dependent on the carrier recombination speed.

Since the semiconductor light-emitting device according to the third embodiment has the graded composition layer 303 provided between the base layer 304 and the collector layer 302 to have a gradually varying composition which is nearly equal to the composition of the base layer 304 at the interface with the base layer 304 and to the composition of the collector layer 302 at the interface with the collector layer 302, the interface barrier between the base layer 304 and the collector layer 302 during the extinction period is reduced significantly compared with a device which does not have the graded composition layer 303. As a result, the holes reaching the interface between the base layer 304 and the graded composition layer 303 swiftly move to the collector layer 302 so that light emission from the device during the extinction period is further suppressed.

Thus, the third embodiment achieves a high extinction ratio with a low reverse bias voltage and thereby enables high-speed switching between the light-emitting operation and the light-extinct operation.

In addition, the base and the collector are set at equal potentials during the extinction period so that it is unnecessary to apply a reverse voltage. This provides a driving circuit with a simpler structure and a easier driving method.

Embodiment 4

A fourth embodiment of the present invention will be described with reference to the drawings.

Figure 7:
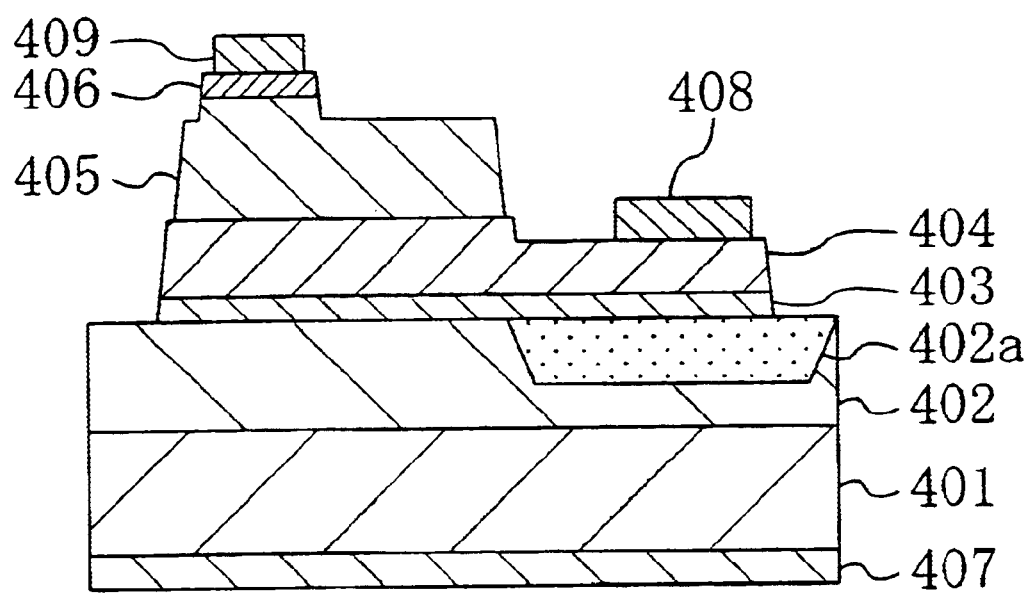
FIG. 7 is a structural cross-sectional view of an npn-type semiconductor light-emitting device in a triode configuration according to a fourth embodiment of the present invention.

FIG. 7 shows a cross-sectional structure of a semiconductor light-emitting device in a triode configuration according to the fourth embodiment, which is an npn-type semiconductor light-emitting device composed of an AlGaAs-based compound semiconductor.

As shown in FIG. 7, the semiconductor light-emitting device according to the fourth embodiment has: a collector layer 402 composed of n-type $Al_{0.4}Ga_{0.6}As$; a graded composition layer 403 with a film thickness of about 20 nm; a base layer 404 composed of p-type GaAs with a film thickness of about 300 nm; and an emitter layer 405 composed of n-type $Al_{0.3}Ga_{0.7}As$, which are formed successively on a substrate 401 composed of n-type GaAs.

The fourth embodiment features the graded composition layer 403 provided between the collector layer 402 and the base layer 404 to have a composition which is nearly equal to the composition of the collector layer 402 at the interface with the collector layer 402 and to the composition of the base layer 404 at the interface with the base layer 404. The film thickness of the graded composition layer 403 is adjusted appropriately to about 5 nm to about 100 nm.

The forbidden band as an electron energy band in the base layer 404 composed of p-type GaAs is smaller in width than the forbidden band in each of the collector layer 402 and the emitter layer 405 each composed of n-type AlGaAs.

An n-type collector layer 407 is formed on the surface of the substrate 401 opposite to the collector layer 402.

The upper surface of the base layer 404 is exposed and a p-type base electrode 408 is formed on the exposed region in spaced apart relation to the side surface of the emitter layer 405.

An n-type contact layer 406 composed of n-type high-concentration GaAs is formed on a part of the emitter layer 405. An n-type emitter electrode 409 is formed on the n-type contact layer 406.

In the semiconductor light-emitting device according to the fourth embodiment, a high-resistance region 402a is formed by ion implantation in the region of the collector layer 402 which is opposed to the p-type base electrode 408 and is not opposed to the emitter layer 405.

The impurity concentration in each of the graded composition layer 403 and the base layer 404 is adjusted to about $1\times10^{17}$ cm$^{-3}$, while the impurity concentration in the collector layer 402 is adjusted to about $5\times10^{17}$ cm$^{-3}$. On the other hand, the impurity concentration in the emitter layer 405 is adjusted to about $1\times10^{18}$ cm$^{-3}$, which is about twice as high as the impurity concentration in the collector layer 402. This improves the efficiency of carrier injection from the emitter layer 405 to the base layer 404.

The impurity concentration in the emitter layer 405 is effective if at least the portion thereof opposed to the collector layer 402 has an impurity concentration which is double the impurity concentration in the other portion thereof or higher.

In the fourth embodiment, n-type $Al_{0.3}Ga_{0.7}As$ is used for the emitter layer 405 and n-type $Al_{0.4}Ga_{0.6}As$ containing aluminium in a larger proportion than in the emitter layer 405 is used for the collector layer 402. As a consequence, electronic affinity in the electron energy bands in the collector layer 402 becomes smaller by about 10 meV. In other words, the energy value at the lower end of the conduction band in the collector layer 402 becomes larger than the energy value at the lower end of the conduction band in the emitter layer 405 by about 10 meV. This suppresses a flow of electrons into the collector layer 402 during a light-emitting period. In addition, a leakage current from the emitter layer 405 to the collector layer 402 can be suppressed and reverse electron injection from the collector layer 402 to the base layer 404 can also be suppressed.

Thus, in the semiconductor light-emitting device of the fourth embodiment which is the npn-type triode device, the forbidden band width in the base layer 404 has been adjusted to be smaller than the forbidden band width in each of the collector layer 402 and the emitter layer 405 so that the base layer 404 has a light-emitting function for generating recombination light, instead of providing an independent active layer.

Since the semiconductor light-emitting device according to the fourth embodiment has the conductivity type opposite to that of the semiconductor light-emitting device according to the third embodiment, electrons are supplied from the emitter layer 405 to the base layer 404 during a light-emitting period, while electrons are extracted from the base layer 404 to the collector layer 402 during an extinction period. Since the graded composition layer 403 is provided between the base layer 404 and the collector layer 402, the impurity concentration has been adjusted to be higher in the emitter layer 405 than in the collector layer 402 and the lower lend of the conduction band has been adjusted to be lower in the collector layer 402 than in the emitter layer 405, similarly to the third-embodiment, high-speed operation is performed.

Since it is unnecessary to apply a reverse bias voltage between the base and the collector during the extinction period, similarly to the third embodiment, a simpler driving circuit can be used appropriately.

In addition, the fourth embodiment has provided the high-resistance region 402a in the region of the collector layer 402 which is not opposed to the emitter layer 405 so that carrier injection in the reverse direction from the collector layer 402 toward the base layer 404 can be suppressed. Even if equal potentials are applied to the collector layer 402 and the emitter layer 405, therefore, unrequired light emission does not occur in the peripheral portion of the base layer 404. This provides an easier method for driving the semiconductor light-emitting device and improves the efficiency of light emission.

Embodiment 5

A fifth embodiment of the present invention will be described with reference to the drawings.

Figure 8:
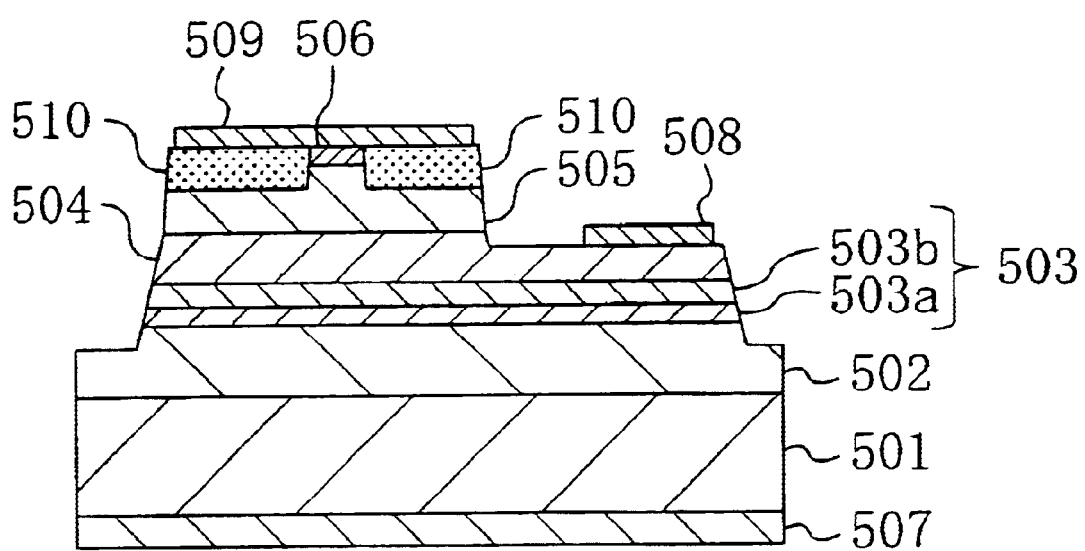
FIG. 8 is a structural cross-sectional view of a pnp-type semiconductor light-emitting device in a triode configuration according to a fifth embodiment of the present invention.

FIG. 8 shows a cross-sectional structure of a semiconductor light-emitting device in a triode configuration according to the fifth embodiment, which is a pnp-type semiconductor light-emitting device composed of an AlGaAs/GaAs/GaInP-based compound semiconductor.

As shown in FIG. 8, the semiconductor light-emitting device according to the fifth embodiment has: a collector layer 502 composed of p-type GaInP, an undoped semiconductor layer 503 consisting of a collector-side undoped layer 503a composed of intrinsic GaInP and a base-side undoped layer 503b composed of intrinsic GaAs and having a total thickness of about 120 nm, a base layer 504 composed of n-type GaAs with a thickness of about 300 nm, and an emitter layer 505 composed of p-type $Al_{0.3}Ga_{0.7}As$ and having an upper portion patterned into a ridge-shaped configuration.

The fifth embodiment features the undoped semiconductor layer 503 provided between the collector layer 502 and the base layer 504 to have an impurity concentration of $5 \times 10^{16}$ cm$^{-3}$ or less.

Moreover, the width of the forbidden band as an electron energy band is smaller in the base layer 504 composed of n-type GaAs than in each of the collector layer 502 composed of p-type GaInP and the emitter layer 505 composed of p-type AlGaAs.

A p-type collector electrode 507 is formed on the surface of the substrate 501 opposed to the collector layer 502.

The upper surface of the base layer 504 is exposed and an n-type base electrode 508 is formed on the exposed region in spaced apart relation to the side surface of the emitter layer 505.

A p-type contact layer 506 composed of p-type high-concentration GaAs is formed on the ridge-shaped region of the emitter layer 505. A current constricting layer 510 composed of a silicon dioxide ($SiO_2$) is buried above the emitter layer 505 and sidewise of the ridge-shaped region to have an upper surface nearly flush with the upper surface of the current constricting layer 510. A p-type emitter electrode 509 is formed on the current constricting layer 510 to come in contact with the p-type contact layer 506.

In the five embodiment, the impurity concentration in the base layer 504 has been adjusted to the about $1 \times 10^{17}$ cm$^{-3}$, while the impurity concentration in each of the collector layer 502 and the emitter layer 505 has been adjusted to $1 \times 10^{18}$ cm$^{-3}$.

On the other hand, p-type $Al_{0.3}Ga_{0.7}As$ is used for the emitter layer 505 and p-type GaInP having a composition which substantially lattice-matches with the substrate 501 composed of GaAs is used for the collector layer 502. As a consequence, the sum of electronic affinity and forbidden band width is larger in the electron energy bands of the collector layer 502 than in the emitter layer 505 by about 50 meV or more. In other words, the energy value at the upper end of the valence band in the collector layer 502 becomes smaller than the energy value at the upper end of the valence band in the emitter layer 505 by about 50 meV or more. If the energy value at the upper end of the valence band in the collector layer 502 is lower by about 10 meV than in the emitter layer 505, a flow of holes into the collector layer 502 during a light-emitting period can be suppressed.

By thus using AlGaAs in the emitter layer 505, GaInP in the collector layer 502, and GaAs in the base layer 504, the resistivity of the collector layer 502 can be reduced to a low value, while increasing a band offset due to the heterojunction interface between the individual semiconductor layers.

Since the semiconductor light-emitting device according to the fifth embodiment has the upper surface covered with the p-type emitter electrode 509 and the current constricting layer 510, light emitted from the base layer 504 is released not in the front-to-rear direction of the substrate 501 but from a cleaved end surface of the light-emitting device.

Since the fifth embodiment features the undoped semiconductor layer 503 having an impurity concentration of $5 \times 10^{16}$ cm$^{-3}$ or less and provided between the collector layer 502 and the base layer 504, a leakage current from the emitter layer 505 to the collector layer 502 can be suppressed even if the respective impurity concentrations in the emitter layer 505 and the collector layer 502 are set to substantially equal values. Moreover, hole injection in the reverse direction from the collector layer 502 to the base layer 504 can also be suppressed.

Since the undoped semiconductor layer 503 reduces the amount of electrostatic capacitance between the base and the collector during the light-emitting period, high-speed driving can be performed easily.

Figure 9A:
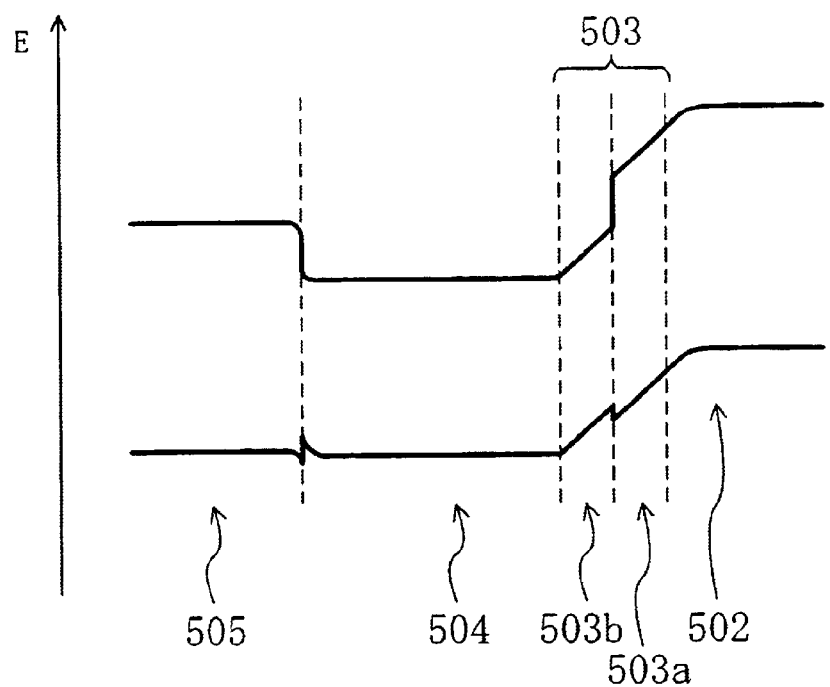
FIG. 9A is a band diagram of the electron energy bands in the semiconductor light-emitting device according to the fifth embodiment during the extinction period.
Figure 9B:
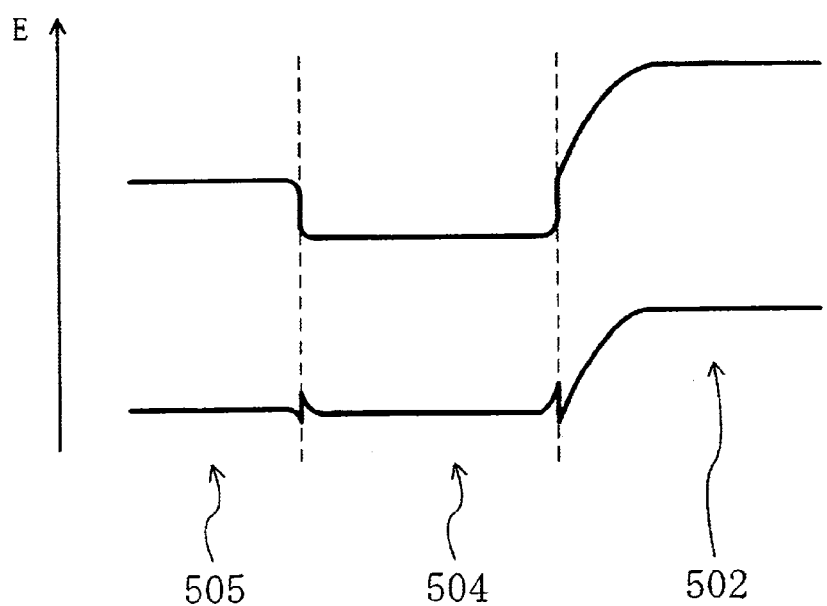
FIG. 9B is a band diagram of the electron energy bands in a comparative semiconductor light-emitting device without an undoped semiconductor layer during the extinction period.

Since the undoped semiconductor layer 503 sharpens a potential gradient in the interface barrier (spike) between the base and the collector during an extinction period, as shown in the band structure of FIG. 9A, holes are less likely to be accumulated in the interface barrier so that the value of the extinction ratio is increased. FIG. 9B is for comparison and shows a band structure during the extinction period when the undoped semiconductor layer 503 is not provided between the base layer 504 and the collector layer 502. As shown in FIG. 9B, when the undoped semiconductor layer 503 is not provided between the base layer 504 and the collector layer 502, an interface barrier due to a band offset occurs at the interface between the base layer 504 and the collector layer 502.

Since the fifth embodiment need not apply a reverse bias voltage between the base and the collector during the extinction period, similarly to the third embodiment, a simpler driving circuit can be used appropriately.

Although the fifth embodiment has provided the opposing surfaces of the collector layer 502 and the base layer 504 with the respective undoped layers such that the collector-side undoped layer 503a and the base-side undoped layer 503b compose the undoped semiconductor layer 503, it is also possible to use only one of the collector-side undoped layer 503a and the base-side undoped layer 503b as an undoped layer.

By controlling the impurity distribution in the base layer 504 or the collector layer 502, the impurity concentration in the interface with the base layer 504 or the collector layer 502 can be suppressed easily.

It is also possible to provide an undoped graded composition layer between the collector-side undoped layer 503a and the base-side undoped layer 503b composing the undoped semiconductor layer 503. The arrangement reduces the interface barrier during the extinction period. In this case, it is also possible to use only a graded composition layer to compose the undoped semiconductor layer 503 instead of using the collector-side undoped layer 503a and the base-side undoped layer 503b.

Although the fifth embodiment has used GaAs for the base layer 504, if the forbidden band width in the base layer 504 is increased by using $Al_xGa_{1-x}As$ (where $0<x\leq0.3$) containing aluminium, the wavelength of emitted light can be reduced.

Although the fifth embodiment has used AlGaAs for the emitter layer 505, if GaInP is used similarly to the collector layer 502, the effect of confining carriers to the base layer 504 can be enhanced. Conversely, if AlGaAs is used for the collector layer 502, the undoped semiconductor layer 503 or the graded composition layer can be formed between the base layer 504 and the collector layer 502 in an easier fabrication process.

Embodiment 6

A sixth embodiment of the present invention will be described with reference to the drawings.

Figure 10:
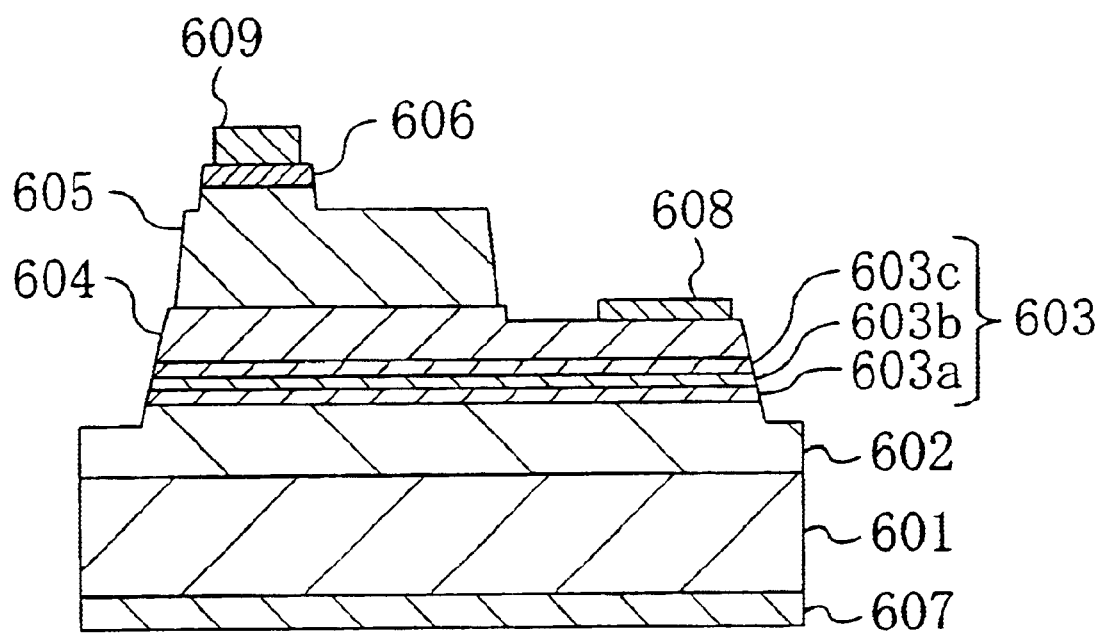
FIG. 10 is a structural cross-sectional view of a pnp-type semiconductor light-emitting device in a triode configuration according to a sixth embodiment of the present invention.

FIG. 10 shows a cross-sectional structure of a semiconductor light-emitting device in a triode configuration according to the sixth embodiment, which is a pnp-type semiconductor light-emitting device composed of a GaAs/AlGaAs-based compound semiconductor.

As shown in FIG. 10, the semiconductor light-emitting device according to the sixth embodiment has: a collector layer 602 composed of p-type $Al_{0.3}Ga_{0.7}As$; an n-type lightly doped base layer 603; a base layer 604 composed of n-type GaAs with a film thickness of about 300 nm; and an emitter layer 605 composed of p-type $Al_{0.3}Ga_{0.7}As$, which are formed successively on a substrate 601 composed of p-type GaAs.

The width of the forbidden band as an electron energy band is smaller in the base layer 604 composed of n-type GaAs than in each of the collector layer 602 and the emitter layer 605 each composed of p-type AlGaAs.

The sixth embodiment features the lightly doped base layer 603 provided between the collector layer 602 and the base layer 604 and consisting of a collector-side lightly doped layer 603a composed of n-type $Al_{0.3}Ga_{0.7}As$ with a thickness of about 35 nm, a graded composition layer 603b with a thickness of about 25 nm, and a base-side lightly doped layer 603c composed of n-type GaAs with a thickness of about 10 nm, which are formed successively on the collector layer 602. The impurity concentration in each of the collector-side lightly doped layer 603a, the graded composition layer 603b, and the base-side lightly doped layer 603c has been adjusted to $1 \times 10^{17}$ cm$^{-3}$.

The graded composition layer 603b has a composition which is nearly equal to the composition of the base-side lightly doped layer 603c at the interface with the base-side lightly doped layer 603c and to the composition of the collector-side lightly doped layer 603a at the interface with the collector-side lightly doped layer 603a.

A p-type collector electrode 607 is formed on the surface of the substrate 601 opposite to the collector layer 602.

The upper surface of the base layer 604 is exposed and an n-type base electrode 608 is formed on the exposed region in spaced apart relation to the side surface of the emitter layer 605.

A p-type contact layer 606 composed of p-type high-concentration GaAs is formed on a part of the emitter layer 605. A p-type emitter electrode 609 is formed on the p-type contact layer 606.

In the sixth embodiment, the impurity concentration in the base layer 604 is adjusted to about $1 \times 10^{18}$ cm$^{-3}$ and the impurity concentration in the collector layer 605 is adjusted to about $1 \times 10^{17}$ cm$^{-3}$. On the other hand, the impurity concentration in the emitter layer 605 is adjusted to about $1 \times 10^{18}$ cm$^{-3}$, which is ten times higher than the impurity concentration in the collector layer 602. As a result, the efficiency of carrier injection from the emitter layer 605 to the base layer 604 is improved compared with the efficiency of carrier injection from the collector layer 602 to the base layer 604. The impurity concentration in the emitter layer 605 is effective in improving the efficiency of injection from the emitter layer 605 if it is increased to a value about double the impurity concentration in the collector layer 602. The impurity concentration in the emitter layer 605 is effective if at least the portion thereof opposed to the collector layer 602 has an impurity concentration which is double the impurity concentration in the other portion thereof or higher.

Preferably, the sum of electronic affinity and forbidden band width is larger in the electron energy bands of the collector-side lightly doped layer 603a than in the base layer 604 by about 20 meV or more. In other words, the energy value at the upper end of the valence band in the collector-side lightly doped layer 603a is preferably smaller than the energy value at the upper end of the valence band in the base layer 604 by about 20 meV or more. In the arrangement, even if a forward bias voltage is applied between the collector and the base during a light-emitting period, a barrier against carriers moving from the collector layer 602 to the base layer 604 occurs.

If the conductivity type of the semiconductor light-emitting device is inverted so that the collector-side lightly doped layer 603a has an n-type conductivity, the energy value at the lower end of the conduction band is preferably larger by about 20 meV or more than in the base layer 604.

A description will be given herein below to the light-emitting operation and light-extinct operation of the semiconductor light-emitting device thus constituted.

The description will be given first to the light-emitting operation.

Figure 11:
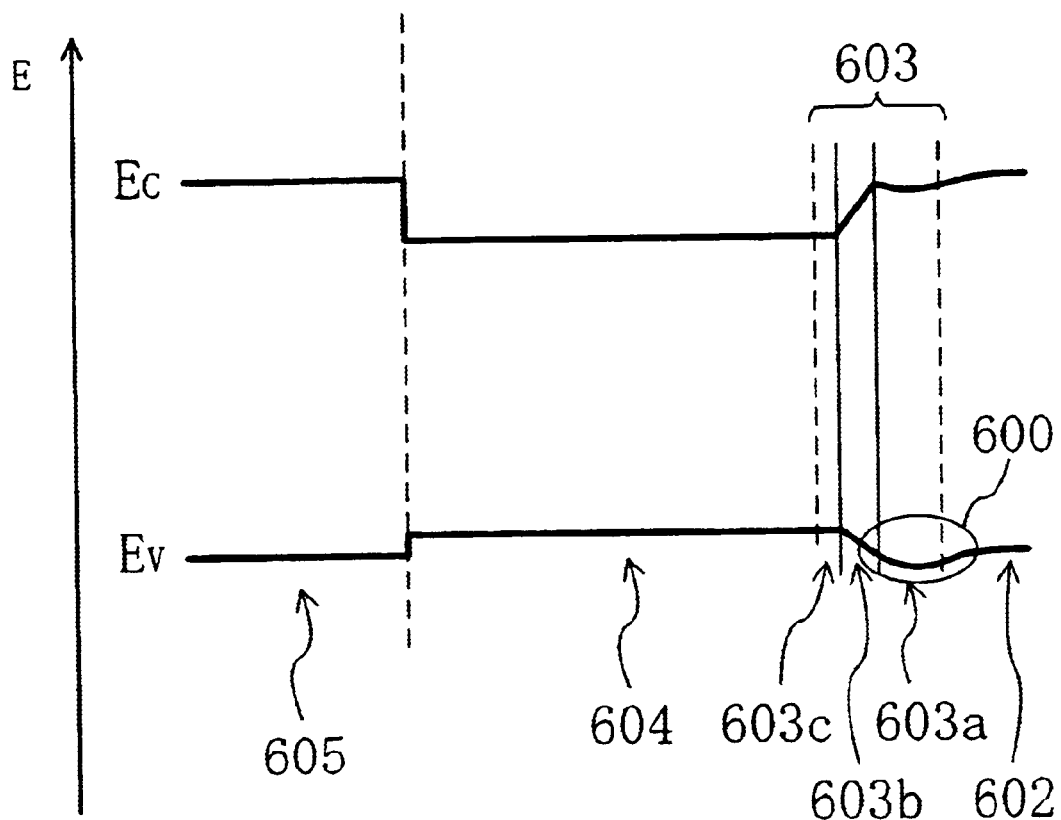
FIG. 11 is a band diagram of the electron energy bands in the semiconductor light-emitting device according to the sixth embodiment during the light-emitting period.

FIG. 11 shows the structure of electron energy bands in the base layer 604 and its vicinity during the light-emitting period. In FIG. 11, reference numerals associated with energy levels correspond to the semiconductor layers shown in FIG. 10.

During the light-emitting operation, forward bias voltages at equal potentials are applied between the base layer 604 and the emitter layer 605 and between the base layer 604 and the collector layer 602.

In the sixth embodiment, the energy value at the upper end of the valence band is equal in each of the emitter layer 605 and the collector layer 602, as shown in FIG. 11. However, the n-type lightly doped base layer 603 is provided between the n-type base layer 604 and the p-type collector layer 602 to form the pn junction with the collector layer 602, which causes an energy barrier 600 against holes between the base layer 604 and the collector layer 602. The energy barrier 600 prevents hole injection in the reverse direction from the collector layer 602 to the base layer 604 even if the emitter layer 605 and the collector layer 602 are set at precisely equal values. This suppresses light emission from the portion of the base layer 604 underlying the n-type base electrode 608 and from the exposed portion of the base layer 604.

Since the emitter layer 605 and the collector layer 602 can be set at equal values, the device can be driven by an easier method and a leakage current from the emitter layer 605 to the collector layer 602 does not occur.

Since carrier injection in the reverse direction from the collector layer 602 to the base layer 604 can be prevented, it is no more necessary to provide the collector layer 402 with the high-resistance region 402a as in the fourth embodiment so that the device is fabricated in a reduced number of process steps.

Even if the emitter layer 605 and the collector layer 602 are at different potentials during the light-emitting period, the energy barrier 600 caused by the lightly doped base layer 603 suppresses a leakage current between the emitter layer 605 and the collector layer 602.

Since a depletion layer is formed at the interface between the lightly doped base layer 603 and the collector layer 602 during the light-emitting period, the amount of electrostatic capacitance between the base layer 604 and the collector layer 602 is reduced so that the response of the device when driven at a high speed is improved compared with that of the device which does not have the lightly doped base layer 603.

The description will be given to the light-extinct operation of the semiconductor light-emitting device according to the sixth embodiment.

Figure 12:
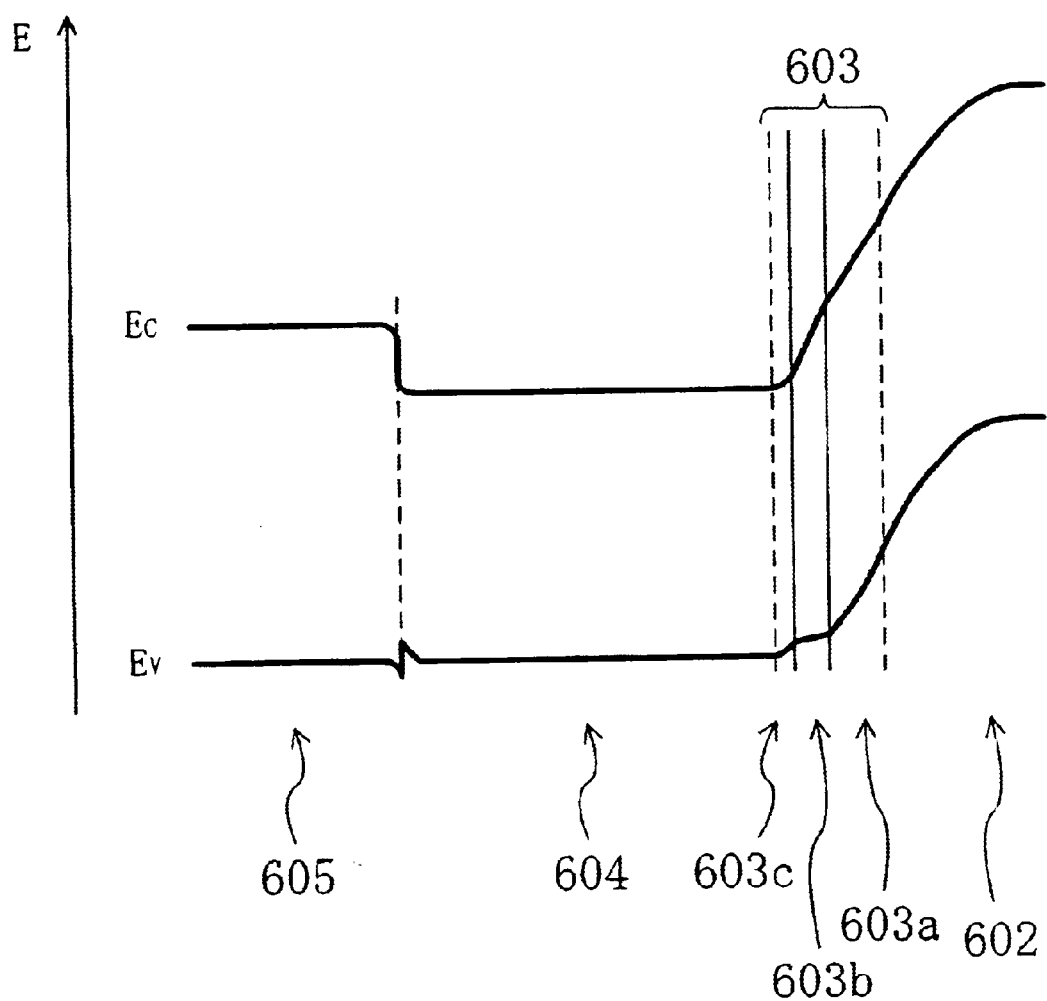
FIG. 12 is a band diagram of the electron energy bands in the semiconductor light-emitting device according to the sixth embodiment during the extinction period.

FIG. 12 shows the structure of electron energy bands during an extinction period. In FIG. 12, reference numerals associated with energy levels correspond to the semiconductor layers shown in FIG. 10.

During the extinction period, a forward bias voltage is applied between the emitter layer 605 and the base layer 604, while the collector layer 602 and the base layer 604 are set at equal potentials. This increases the width of the depletion layer compared with the case where a forward bias voltage is applied between the collector layer 602 and the base layer 604 and therefore the lightly doped base layer 603 and the collector layer 602 cannot confine the holes any more. As a result, the holes are extracted from the base layer 604 to the collector layer 602 so that a current flows in large quantity between the emitter and the collector, while the concentration of the holes in the base layer 604 is reduced and the amount of light emitted from the base layer 604 is reduced.

Since the sixth embodiment has provided the graded composition layer 603b between the collector-side lightly doped layer 603a and the base-side lightly doped layer 603c, the interface barrier between the collector-side lightly doped layer 603a and the base-side lightly doped layer 603c is weakened so that the effect of extracting carriers during the extinction period is particularly enhanced. This allows the semiconductor light-emitting device according to the sixth embodiment to perform high-speed light-emitting and light-extinct operations.

Since it is unnecessary to apply a reverse bias voltage between the base and the collector during the extinction period and reverse hole injection from the collector layer 602 to the base layer 604 is suppressed, not only the fabrication of the device but also the driving method for the device are facilitated.

As a variation of the sixth embodiment, a structure which does not have the graded composition layer 603b between the collector-side lightly doped layer 603a and the base-side lightly doped layer 603c will be described herein below. Since the arrangement obviates the necessity to form the graded composition layer 603b having a composition which should be varied gradually during the growth thereof, the device can be fabricated in a reduced number of process steps.

Figure 13:
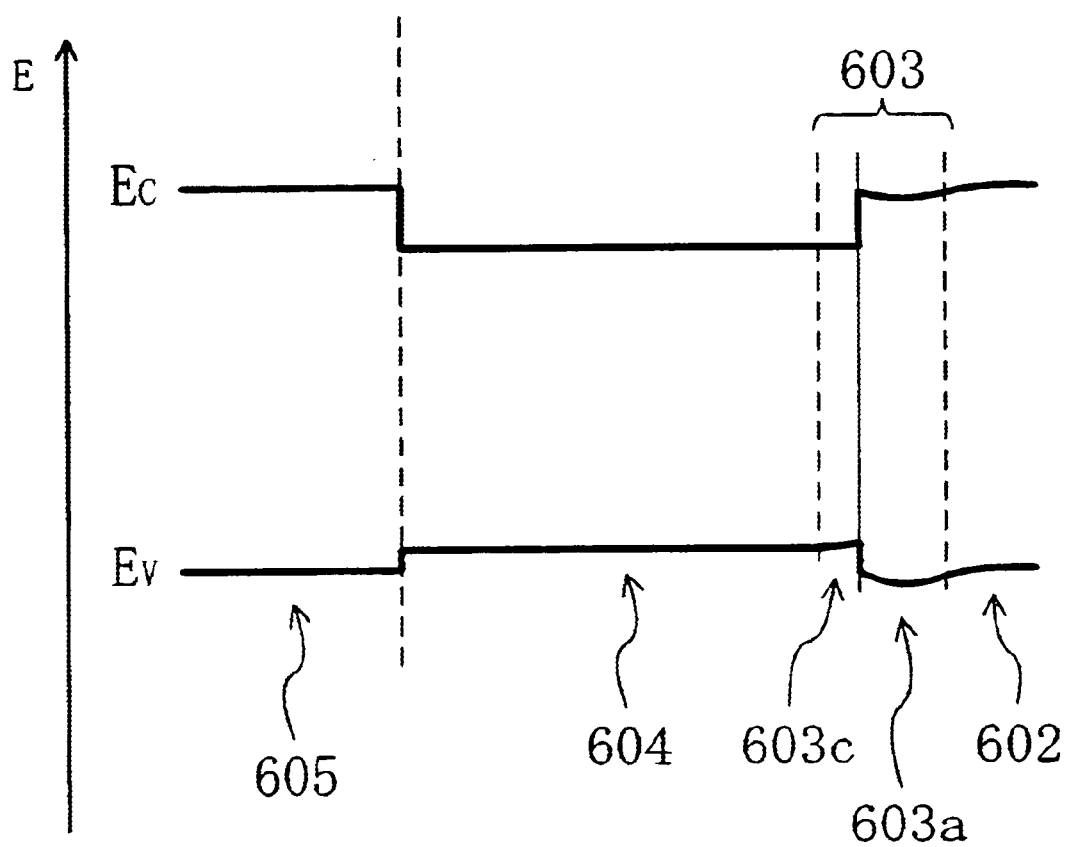
FIG. 13 is a band diagram of the electron energy bands in the semiconductor light-emitting device according to a variation of the sixth embodiment during the light-emitting period.
Figure 14:
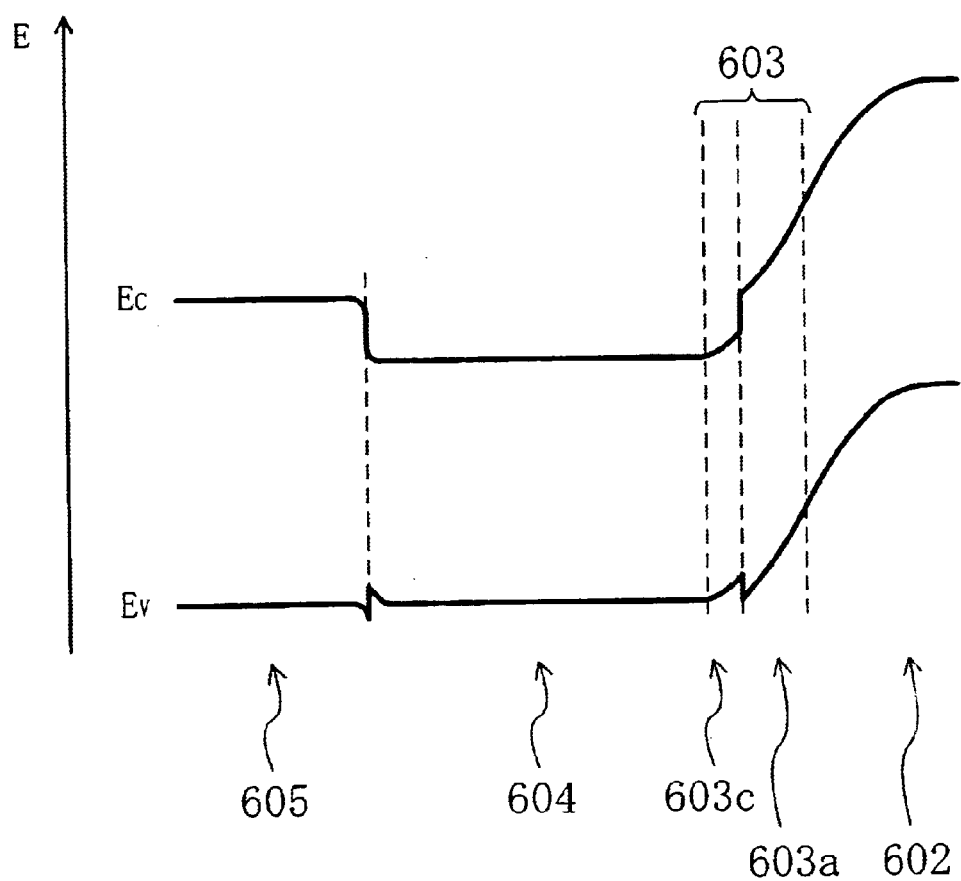
FIG. 14 is a band diagram of the electron energy bands in the semiconductor light-emitting device according to the variation of the sixth embodiment during the extinction period.

FIGS. 13 and 14 show the band structure in a semiconductor light-emitting device according to the present variation, of which FIG. 13 shows the light-emitting period and FIG. 14 shows the extinction period.

As shown in FIG. 14, an interface barrier (spike) resulting from discontinuities in the energy bands occurs between the base layer 604 and the collector layer 602 during the extinction period. However, since the spike is positioned in the center portion of the high-electric-field depletion layer, the influence of the spike is suppressed. As a result, the holes accumulated in the base layer 604 can be extracted reliably to the collector layer 602 so that light emission from the device during the extinction period is suppressed.

In the sixth embodiment and the variation thereof, the impurity concentration in the lightly doped base layer 603 is preferably half the impurity concentration in the base layer 604 or less.

More preferably, the lightly doped base layer 603 has an impurity concentration of $1 \times 10^{16}$ cm$^{-3}$ to $5 \times 10^{17}$ cm$^{-3}$ and a film thickness of 30 nm to 400 nm. In the arrangement, if the emitter layer 605 and the collector layer 602 are set at equal potentials, the lightly doped base layer 603 functions as an energy barrier against carriers. If the base layer 604 and the collector layer 602 are set at equal potentials, the energy barrier can be removed so that the semiconductor light-emitting device according to the sixth embodiment is driven easily and reliably.

The impurity concentration in each of the collector-side lightly doped layer 603a, the graded composition layer 603b, and the base-side lightly doped layer 603c of the lightly doped base layer 603 is controlled as follows. If the collector-side lightly doped layer 603a is taken as an example, a film is formed while it is doped with p-type impurity ions equal to those used to dope the collector layer 602. Then, the portion of the film to be formed with the collector-side lightly doped layer 603a is doped with n-type impurity ions such that the collector-side lightly doped layer 603a has a low n-type impurity concentration.

Although each of the first to sixth embodiment has used the light-emitting diode device using spontaneous light emission as an example of the semiconductor light-emitting device, the present invention is also applicable to an edge-emitting or surface-emitting semiconductor laser device or the like utilizing induced light emission.

As a semiconductor material composing the semiconductor light-emitting device, a Group III-V compound semiconductor such as GaAs, AlAs, InAs, GaP, AlP, InP, GaN, AlN, or InN may be used. Alternatively, a Group II-VI compound semiconductor such as ZnSe, CdSe, MgSe, ZnS, CdS, ZnTe, CdTe, ZnO, CdO, or MgO may be used. It is also possible to use a mixed crystal material of compound semiconductors such as AlGaAs, GaInP, AlGaInP, InGaAsP, AlGaN, InGaN, ZnCdSe, or MgZnO.

Of the foregoing compound semiconductors, if a conductive one is used as the material of the substrate of the semiconductor light-emitting device, an electrode can be formed on the surface of the substrate opposite to the surface formed with the device so that the device is fabricated in a reduced number of process steps.

If a semi-insulating substrate composed of a semi-insulating one of the foregoing compound semiconductors or an insulating substrate composed of sapphire, a silicon dioxide, or the like is used, the electrostatic capacitance of the light-emitting device is reduced so that the RF characteristic thereof is improved. If a plurality of devices are formed, they are insulated from each other, which allows easy integration of the devices.

Embodiment 7

A seventh embodiment of the present invention will be described with reference to the drawings.

Figure 15:
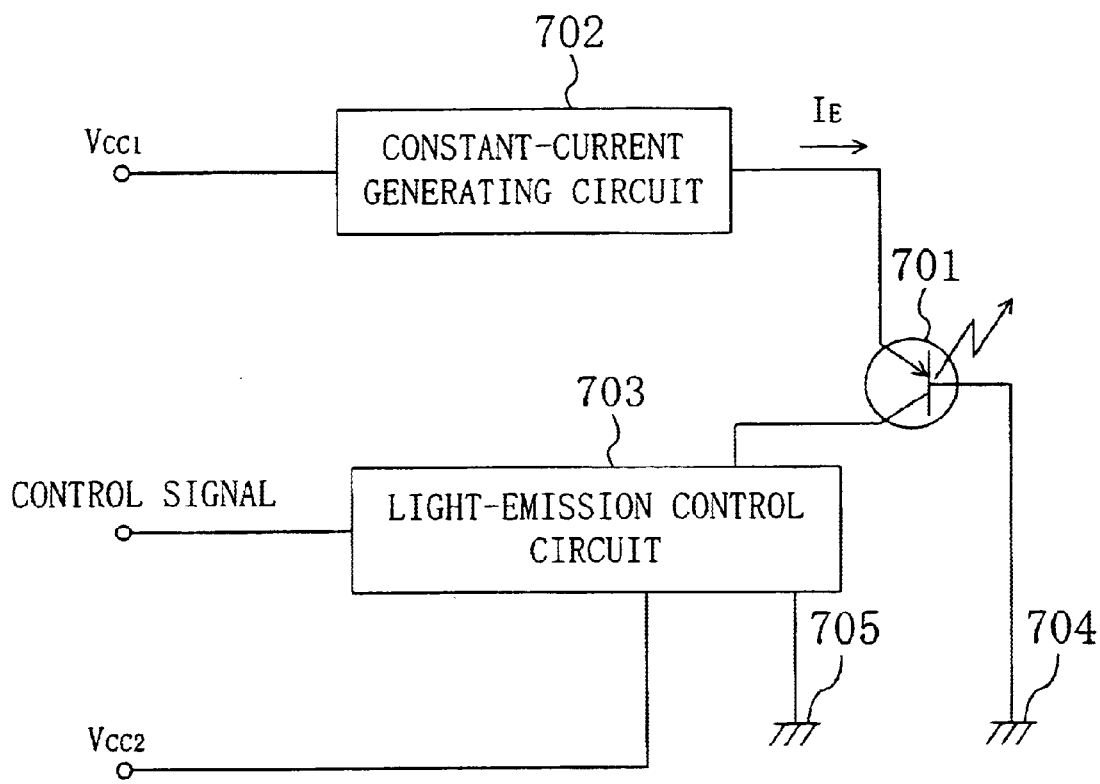
FIG. 15 is a functional block diagram of an apparatus for driving a semiconductor light-emitting device according to a seventh embodiment of the present invention.

FIG. 15 shows the structure of functional blocks in an apparatus for driving a semiconductor light-emitting device according to the seventh embodiment.

As shown in FIG. 15, the apparatus for driving the semiconductor light-emitting device according to the seventh embodiment is of pnp-type, which comprises: a semiconductor light-emitting device 701 in a triode configuration composed of an emitter, a base, and a collector; a constant-current generating circuit 702 as constant-current control means for receiving a first power-source voltage $V_{CC1}$ and supplying a specified driving current $I_E$ to the emitter of the semiconductor light-emitting device 701; and a light-emission control circuit 703 as light-emission control means 702 for receiving a control signal and a second power-source voltage $V_{CC2}$, controlling a potential at the collector of the semiconductor light-emitting device 701, and thereby controlling a state of light emitted from the semiconductor light-emitting device 701.

The base of the semiconductor light-emitting device 701 is connected to a first ground terminal 704 as specified-potential applying means.

The constant-current generating circuit 702 supplies the driving current $I_E$ to the emitter of the semiconductor light-emitting device 701 such that a forward bias voltage is applied between the emitter and the base.

The light-emission control circuit 703 switches the collector of the semiconductor light-emitting device 701 between a high-potential state or high-resistance state and a low-potential state in response to the control signal inputted from the outside.

The semiconductor light-emitting device 701 is brought into a light-emitting state when, if a forward bias voltage applied between the collector and the base is assumed to be a positive potential, the collector potential is higher than the base potential, i.e., the collector and the base are in a forward bias state or set at equal potentials, similarly to the semiconductor light-emitting device according to the first embodiment. Conversely, the semiconductor light-emitting device 701 is brought into a non-light-emitting state when the collector potential is sufficiently low, i.e., the collector and the base are in a reverse bias state.

A description will be given herein below to a specific example of the driving method implemented by the apparatus for driving the semiconductor light-emitting device according to the seventh embodiment during light-emitting and extinction periods.

The description will be given first to a light-emitting operation.

When the light-emission control circuit 703 is operated with the control signal from the outside and brought into a high-resistance state when viewed from the collector of the semiconductor light-emitting device 701, the potential at the collector of the semiconductor light-emitting device 701 is set at an intermediate potential between the base and emitter potentials, whereby the semiconductor light-emitting device 701 is brought into the light-emitting state. In accordance with another method, e.g., the collector of the semiconductor light-emitting device 701 is grounded to a second ground terminal 705 so that the collector and base are set at equal potentials, whereby the semiconductor light-emitting device 701 is brought into the light-emitting state.

The description will be given next to a light-extinct operation.

When the second power-source voltage $V_{CC2}$ is applied to the collector of the semiconductor light-emitting device 701 by operating the light-emission control circuit 703 with the control signal from the outside, the collector and the base are brought into the reverse bias state. If the second power-source voltage $V_{CC2}$ is sufficiently high in the reverse bias state, the majority of charge injected from the emitter is extracted to the collector so that the carrier density in the active layer is reduced. Once the effect of confining the carriers to the active layer lowers and the extraction of the carriers to the collector is initiated, a current injected from the emitter tends to increase. In the seventh embodiment, however, a constant amount of current is supplied to the emitter under the control of the constant-current generating circuit 702.

Accordingly, the forward bias voltage between the emitter and the base lowers and the quasi-Fermi level at the opposing surface of the emitter composing the interface between the emitter and the active region lowers. This reduces the carrier density not only at the interface between the active region and the base but also at the interface between the active region and the emitter, so that the carrier density in the active region is reduced significantly and light emission from the semiconductor light-emitting device 701 is further suppressed.

Thus, the seventh embodiment easily and reliably increases the extinction ratio of the semiconductor light-emitting device 701 in a triode configuration.

It is also possible to use, e.g., an npn-type bipolar transistor as an example of the light-emission control circuit 703 according to the seventh embodiment. By connecting the collector terminal of the bipolar transistor to the collector of the semiconductor light-emitting device 701 and connecting the emitter terminal to the second power-source voltage $V_{CC2}$ such that the control signal is inputted to the base terminal, the light-emission control circuit 703 can easily be implemented.

A pnp-type bipolar transistor can also be used for the light-emission control circuit 703. In this case, the emitter terminal of the bipolar transistor is connected to the collector of the semiconductor light-emitting device 701 and the collector terminal is connected to the second power-source voltage $V_{CC2}$ such that the control signal is inputted to the base terminal.

The configuration of the light-emission control circuit 703 is not limited to the npn-type or pnp-type bipolar transistor. The light-emission control circuit 703 may also be composed of a multi-stage transistor. By using a field-effect transistor (FET), a high-electron-mobility transistor (HEMT), or the like, a more stable and higher-speed driving operation can be performed. Therefore, the circuit configuration is not limited provided that the function of the light-emission control circuit 703 is implemented.

Embodiment 8

An eighth embodiment of the present invention will be described with reference to the drawings.

Figure 16:
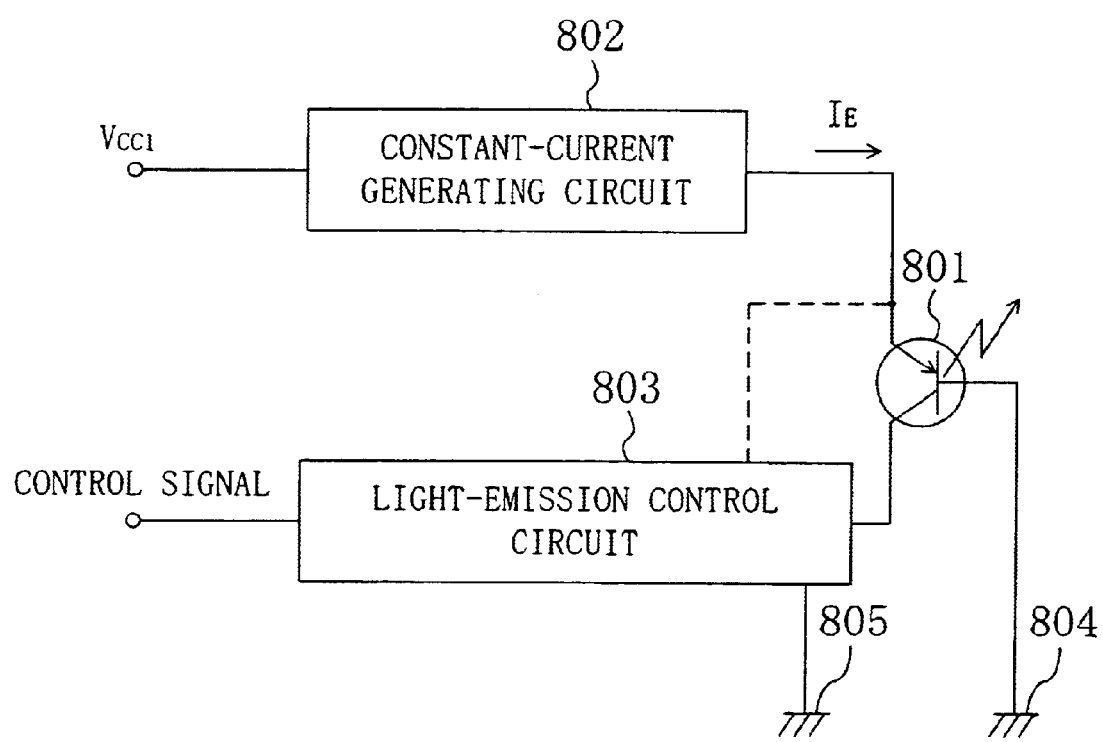
FIG. 16 is a functional block diagram of an apparatus for driving a semiconductor light-emitting device according to an eighth embodiment of the present invention.

FIG. 16 shows the structure of functional blocks in an apparatus for driving a semiconductor light-emitting device according to the eighth embodiment.

As shown in FIG. 16, the apparatus for driving the semiconductor light-emitting device according to the eighth embodiment is of pnp-type, which comprises: a semiconductor light-emitting device 801 in a triode configuration composed of an emitter, a base, and a collector; a constant-current generating circuit 802 as constant-current control means for receiving a first power-source voltage $V_{CC1}$ and supplying a specified driving current $I_E$ to the emitter of the semiconductor light-emitting device 801; and a light-emission control circuit 803 as light-emission control means for receiving a control signal, controlling a potential at the emitter or collector of the semiconductor light-emitting device 801, and thereby controlling a state of light emitted from the semiconductor light-emitting device 801.

The base of the semiconductor light-emitting device 801 is connected to a first ground terminal 804 as specified-potential applying means.

The constant-current generating circuit 802 supplies a driving current $I_E$ to the emitter of the semiconductor light-emitting device 801 such that a reverse bias voltage is applied between the emitter and the base.

The light-emission control circuit 803 switches the collector of the semiconductor light-emitting device 801 between a high-potential state or high-resistance state and a low-potential state in response to the control signal inputted from the outside.

The semiconductor light-emitting device 801 is brought into a light-emitting state when, if a forward bias voltage applied between the collector and the base is assumed to be a positive potential, the collector potential is higher than the base potential, i.e., the collector and the base are in a forward bias state, similarly to the semiconductor light-emitting device according to the third embodiment. Conversely, the semiconductor light-emitting device 801 is brought into a non-light-emitting state when the collector and the base are set at nearly equal potentials.

A description will be given herein below to a specific example of the driving method implemented by the apparatus for driving the semiconductor light-emitting device according to the eighth embodiment during light-emitting and extinction periods.

The description will be given first to a light-emitting operation.

When the light-emission control circuit 803 is operated with the control signal from the outside and brought into a high-resistance state when viewed from the collector of the semiconductor light-emitting device 801, the potential at the collector of the semiconductor light-emitting device 801 is set at a potential nearly equal to the emitter potential and brought into a forward bias state relative to the base so that emission occurs. In this case, the light-emission control circuit 803 need not be connected to the emitter of the semiconductor light-emitting device 801. In accordance with another method, the collector of the semiconductor light-emitting device 801 is connected directly to the emitter so that the collector and the base are brought into a forward bias state and light emission occurs.

The description will be given next to a light-extinct operation.

When the collector of the semiconductor light-emitting device 801 is connected to a second ground terminal 805 and a ground potential is applied by operating the light-emission control circuit 803 with the control signal from the outside, carriers cannot be confined between the collector and the base any more. As a result, the majority of charge injected from the emitter is extracted to the collector so that the carrier density in the base is reduced. Since a constant amount of current is supplied to the emitter under the control of the constant-current generating circuit 802, similarly to the seventh embodiment, the forward bias voltage between the emitter and the base is reduced, the carrier density in the base is reduced significantly, and light emission from the device is further suppressed.

Thus, the eighth embodiment easily and reliably increases the extinction ratio of the semiconductor light-emitting device 801 in a triode configuration.

It is also possible to use, e.g., an npn-type bipolar transistor as an example of the light-emission control circuit 803 according to the eighth embodiment. By connecting the collector terminal of the bipolar transistor to the collector of the semiconductor light-emitting device 801 and connecting the emitter terminal to the second ground terminal 805 such that the control signal is inputted to the base terminal, the light-emission control circuit 803 can easily be implemented. In this case, a control voltage of, e.g., 0 V (ground potential) is used as the control signal during the light-emitting operation and a positive control voltage of, e.g., 0.8 V or more is used as the control signal during the extinction period. As a result, the collector terminal of the bipolar transistor is brought into a high-resistance state during the light-emitting period and into a low-potential state (low-resistance state) close to a ground state during the extinction period. This allows control of the light-emitting and light-extinct operations according to the present embodiment.

A pnp-type bipolar transistor can also be used for the light-emission control circuit 803. Specifically, the emitter terminal of the bipolar transistor is connected to the collector of the semiconductor light-emitting device 801 and the collector terminal is connected to the second ground terminal 805 such that the control signal is inputted to the base terminal. In this case, a control voltage higher than the emitter potential during the light-emitting period of the semiconductor light-emitting device 801, e.g., is used as the control signal during the light-emitting period and a control voltage of, e.g., 0 V (ground potential) is used as the control signal during the extinction period. As a result, the emitter terminal of the bipolar transistor is brought into a high-resistance state during the light-emitting period and into a low-potential state (low-resistance state) at about 0.7 V close to the ground state during the extinction operation. This allows control of the light-emitting and light-extinct operations according to the present embodiment.

The configuration of the light-emission control circuit 803 is not limited to the npn-type or pnp-type bipolar transistor. The light-emission control circuit 803 may also be composed of a multi-stage transistor. By using a field-effect transistor (FET), a high-electron-mobility transistor (HEMT), or the like, a more stable and higher-speed driving operation can be performed. Therefore, the circuit configuration is not limited provided that the function of the light-emission control circuit 803 is implemented.

Although each of the seventh and eighth embodiment has described the example in which the pnp-type triode semiconductor light-emitting device is driven with the positive power source, the present invention is also applicable to the driving of the npn-type triode semiconductor light-emitting device. It is also possible to provide a substantially equal circuit configuration by simply reversing the polarity of the power source.

Although each of the seventh and eight embodiment has connected the base of the semiconductor light-emitting device in the triode configuration directly to the first ground terminal, it is also possible to improve controllability over the light-emitting and light-extinct operations by inserting a resistor, a diode device, or the like between the base and the first ground terminal and thereby increasing the base potential such that it is higher than the ground potential.

In each of the seventh and eight embodiments, it is also possible to provide a differentiation circuit composed of a resistor and an electrostatic capacitance or the like for the control signal inputted from the outside and thereby improve the rising characteristic at the initiation of the light-emitting operation and the falling characteristic at the halt of the light-emitting operation (during the extinction period).

What is claimed is:

1. A semiconductor light-emitting device comprising:

first and second semiconductor layers each of a first conductivity type;

a third semiconductor layer of a second conductivity type provided between the first and second semiconductor layers;

an active layer provided between the second and third semiconductor layers, the active layer emitting light with charge injected therein from the second and third semiconductor layers; and a graded composition layer provided between the active layer and the third semiconductor layer to have a varying composition, wherein the composition of the graded composition layer is equal to a composition of the third semiconductor layer at an interface with the third semiconductor layer, and to a composition of the active layer at an interface with the active layer, wherein a base electrode is electrically connected to the third semiconductor layer via the graded composition layer and the active layer, and wherein the forbidden band of the active layer is smaller than the forbidden band of the third semiconductor layer.

2. The semiconductor light-emitting device of claim 1, wherein the composition at the grade composition layer varies continuously.

3. The semiconductor light-emitting device of claim 1, wherein the composition at the grade composition layer varies stepwise.

4. The semiconductor light-emitting device of claim 1, wherein regions of the active layer and the graded composition layer lying between the base electrode and the second semiconductor layer are removed.

5. The semiconductor light-emitting device of claim 1, wherein during a light-emitting period, a forward bias voltage is applied between the third semiconductor layer and the second semiconductor layer, and the potential between the third semiconductor layer and the first semiconductor layer is adjusted to 0.

6. The semiconductor light-emitting device of claim 1, wherein during an extinction period, a reverse bias voltage is applied between the third semiconductor layer and the first semiconductor layer.

7. The semiconductor light-emitting device of claim 1, wherein the third semiconductor layer is n-type.

8. The semiconductor light-emitting device of claim 1, wherein the third semiconductor layer is p-type.

9. The semiconductor light-emitting device of claim 8, wherein a high-resistance region is provided in a region that is opposed to the base electrode in the second semiconductor layer but not opposed to the first semiconductor layer.

10. The semiconductor light-emitting device of claim 9, wherein the high-resistance region is formed by ion implantation.

* * * * *